United States Patent
Lin et al.

(10) Patent No.: US 12,229,488 B2
(45) Date of Patent: Feb. 18, 2025

(54) PHASE SHIFTER CIRCUIT, PHASE SHIFTER LAYOUT AND METHOD OF FORMING THE SAME

(71) Applicant: TAIWAN SEMICONDUCTOR MANUFACTURING COMPANY, LTD., Hsinchu (TW)

(72) Inventors: Chi-Hsien Lin, Hsinchu (TW); Ho-Hsiang Chen, Hsinchu (TW); Hsien-Yuan Liao, Hsinchu (TW); Tzu-Jin Yeh, Hsinchu (TW); Ying-Ta Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 431 days.

(21) Appl. No.: 17/833,436

(22) Filed: Jun. 6, 2022

(65) Prior Publication Data
US 2022/0300694 A1 Sep. 22, 2022

Related U.S. Application Data

(62) Division of application No. 16/442,178, filed on Jun. 14, 2019, now Pat. No. 11,354,481.

(60) Provisional application No. 62/692,425, filed on Jun. 29, 2018.

(51) Int. Cl.
| G03F 1/70 | (2012.01) |
| G03F 1/36 | (2012.01) |
| G06F 30/398 | (2020.01) |
| H03H 11/20 | (2006.01) |

(52) U.S. Cl.
CPC .............. *G06F 30/398* (2020.01); *G03F 1/36* (2013.01); *G03F 1/70* (2013.01); *H03H 11/20* (2013.01)

(58) Field of Classification Search
CPC ...... G06F 30/398; G06F 30/392; G06F 30/20; G03F 1/36; G03F 1/70; G03F 1/56; G03F 1/30; H01L 27/0207; H01L 27/02; H01L 27/0629; H01L 27/78615; H03H 11/20; H03H 11/16; H03H 11/1203; H03H 11/126; H03H 7/25; H03H 7/38; H03H 7/463; H03H 7/18; H03H 7/20
See application file for complete search history.

(56) References Cited

U.S. PATENT DOCUMENTS

| 7,061,295 B2 | 6/2006 | Saiki et al. |
| 7,132,203 B2 | 11/2006 | Pierrat |
| 7,260,442 B2 | 8/2007 | Hwang et al. |
| 7,585,595 B2 | 9/2009 | Pierrat |

(Continued)

*Primary Examiner* — Nikolay K Yushin
(74) *Attorney, Agent, or Firm* — Hauptman Ham, LLP

(57) ABSTRACT

A phase shifter includes a first transistor and a second transistor. The first transistor includes a first gate terminal configured to receive a first voltage. The first transistor is configured to adjust at least a resistance or a first capacitance of the phase shifter responsive to the first voltage. The second transistor is coupled to the first transistor. The second transistor includes a second gate terminal configured to receive a second voltage. The second transistor is configured to adjust a second capacitance of the phase shifter responsive to the second voltage. The second gate terminal includes a first polysilicon portion and a second polysilicon portion extending in a first direction. The first polysilicon portion and the second polysilicon portion are positioned along opposite edges of an active region of the first transistor and the second transistor.

20 Claims, 18 Drawing Sheets

(56) References Cited

U.S. PATENT DOCUMENTS

| | | |
|---|---|---|
| 9,256,709 B2 | 2/2016 | Yu et al. |
| 2009/0081563 A1 | 3/2009 | Wang et al. |
| 2014/0040838 A1 | 2/2014 | Liu et al. |
| 2015/0278429 A1 | 10/2015 | Chang |
| 2019/0065658 A1 | 2/2019 | Peng et al. |
| 2019/0251223 A1 | 8/2019 | Chang et al. |
| 2020/0004920 A1 | 1/2020 | Lin et al. |
| 2020/0020699 A1 | 1/2020 | Fujiwara et al. |

.# PHASE SHIFTER CIRCUIT, PHASE SHIFTER LAYOUT AND METHOD OF FORMING THE SAME

PRIORITY CLAIM AND CROSS-REFERENCE

This application is a divisional of U.S. application Ser. No. 16/442,178, filed Jun. 14, 2019, now U.S. Pat. No. 11,354,481, issued on Jun. 7, 2022, which claims the benefit of U.S. Provisional Application No. 62/692,425, filed Jun. 29, 2018, which are herein incorporated by reference in their entireties.

BACKGROUND

Phase shifters are classified based on certain operating characteristics. The recent trend in miniaturizing integrated circuits (ICs) has resulted in smaller devices which consume less power, yet provide more functionality at higher speeds. As speeds or frequencies increase, the miniaturization process has also resulted in stricter design and manufacturing specifications for phase shifter circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
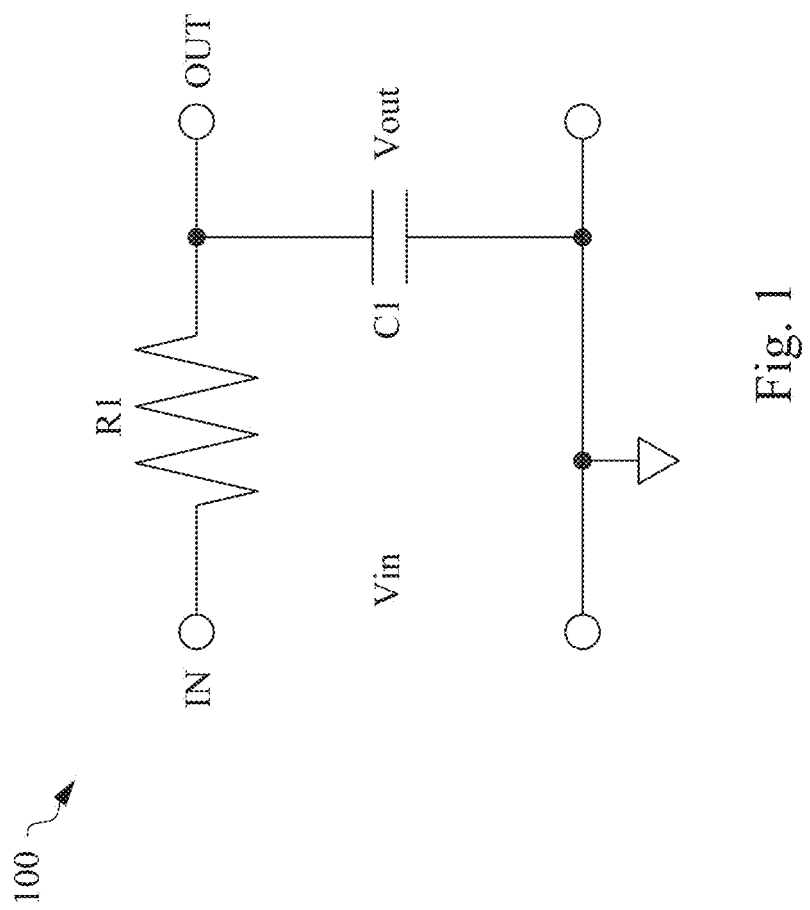
FIG. 1 is a circuit diagram of a phase shifter circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a phase shifter circuit includes an active region, a first set of gates, a second set of gates and a set of contacts. The active region extends in a first direction and is located at a first level. The first set of gates extend in a second direction, overlap the active region, and are located at a second level. The set of contacts extend in the second direction, are over the active region, are located at a third level, and are positioned between at least the second set of gates.

The second set of gates extend in the second direction, overlap the active region and are located at the second level. The second set of gates are positioned along opposite edges of the active region and are configured to receive a first voltage. The second set of gates are part of a first transistor configured to adjust a first capacitance of the phase shifter responsive to the first voltage. In some embodiments, the first capacitance of the phase shifter circuit is adjusted by adjusting the first voltage.

The first set of gates are configured to receive a second voltage. The first set of gates are part of a second transistor configured to adjust a second capacitance or a resistance of the phase shifter responsive to the second voltage. In some embodiments, the second capacitance or the resistance of the phase shifter circuit is adjusted by adjusting the second voltage.

In some embodiments, the second set of gates are located along opposite ends of the active region thereby covering and protecting the ends of the active region or a cell region of the phase shifter circuit during manufacturing or processing, thereby providing additional reliability during processing. In some embodiments, by configuring the second set of gates to be functional or operational as part of the first transistor, the phase shifter circuit is configured with multiple phase tuning mechanisms compared to other approaches that have a single tuning mechanism. In some embodiments, by having multiple tuning mechanisms or controls, the phase shifter circuit has better resolution and a wider adjustable range than other approaches.

Phase Shifter Circuit

FIG. 1 is a circuit diagram of a phase shifter circuit 100, in accordance with some embodiments.

Phase shifter circuit 100 comprises a resistor R1 coupled in series with a capacitor C1. Phase shifter circuit 100 has an input terminal IN configured to receive an input signal Vin, and an output terminal OUT configured to output an output signal Vout. Phase shifter circuit 100 is a low pass filter. Phase shifter circuit 100 is a 1-stage RC phase shifter. Other numbers of stages are within the contemplated scope of the present disclosure.

Phase shifter circuit 100 is configured to shift the phase of the output signal OUT relative to the input signal Vin by a phase shift or a phase difference ΔΘ1 (expressed by formula 1 below). In some embodiments, the input signal IN and the output signal OUT are radio frequency (RF) signals.

A first end of resistor R1 is coupled to the input terminal IN. A second end of resistor R1 is coupled to the output terminal OUT and a first terminal of capacitor C1. A second terminal of capacitor C1 is coupled to a reference voltage supply VSS.

The output signal Vout of phase shifter circuit 100 has a phase shift or a phase difference $\Delta\Theta_1$ relative to the input signal Vin, and is expressed by formula 1:

$$\Delta\Theta_1 = -\tan^{-1}(2*\Pi*F*R*C) \quad (1)$$

where R is the resistance of resistor R1, C is the capacitance of capacitor C1, and F is the cutoff frequency of phase shifter circuit 100.

Figure 2B:
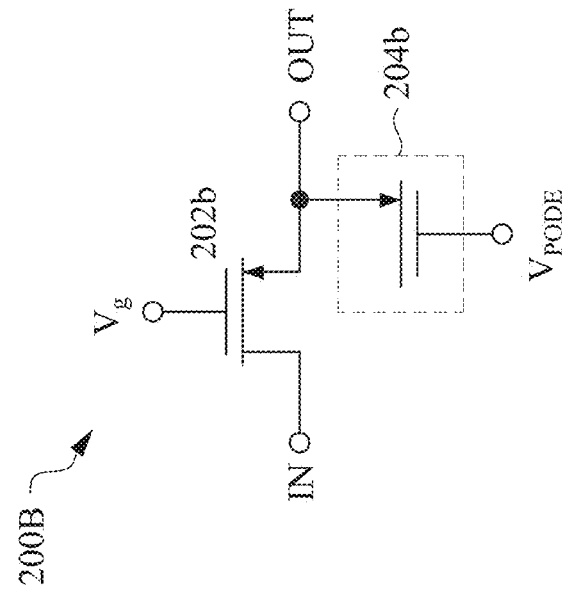
FIG. 2B is a circuit diagram of a phase shifter circuit, in accordance with some embodiments.
Figure 2A:
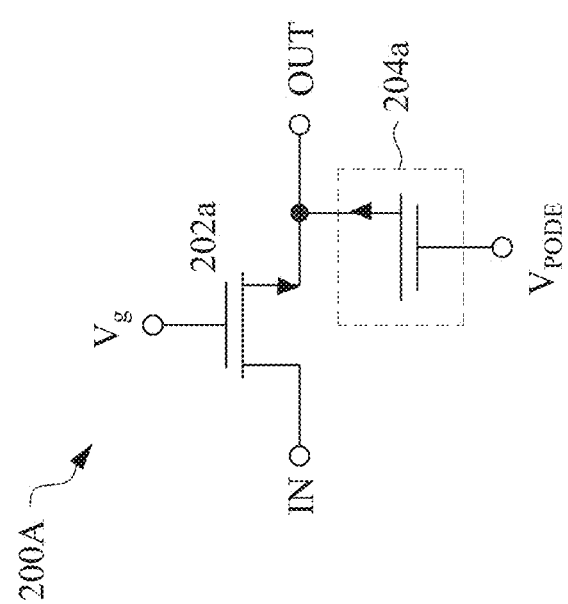
FIG. 2A is a circuit diagram of a phase shifter circuit, in accordance with some embodiments.

FIG. 2A is a circuit diagram of a phase shifter circuit 200A, in accordance with some embodiments.

Phase shifter circuit 200A is an embodiment of phase shifter circuit 100 of FIG. 1. Phase shifter circuit 200A comprises a transistor 202a and a transistor 204a.

Transistor 202a is an embodiment of resistor R1 of FIG. 1, and similar detailed description is omitted. Transistor 204a is an embodiment of capacitor C1 of FIG. 1, and similar detailed description is omitted.

Transistor 202a and transistor 204a are N-type metal oxide semiconductor (NMOS) transistors. In some embodiments, at least transistor 202a or transistor 204a is a P-type metal oxide semiconductor (PMOS) transistor.

A gate terminal of transistor 202a is configured to receive a signal VG. A drain terminal of transistor 202a is coupled to an input terminal IN. A source terminal of transistor 202a is coupled to the output terminal OUT and a source terminal of transistor 204a. In some embodiments, transistor 202a is configured as resistor R1 of FIG. 1.

A gate terminal of transistor 204a is configured to receive a signal $V_{PODE}$. In some embodiments, transistor 204a is configured as capacitor C1 of FIG. 1. Transistor 204a does not include a drain terminal. In some embodiments, transistor 204a includes a drain terminal (not shown), but the drain terminal is electrically floating.

Other types of transistors or numbers of transistors in phase shifter circuit 200A are within the contemplated scope of the present disclosure.

FIG. 2B is a circuit diagram of a phase shifter circuit 200B, in accordance with some embodiments.

Phase shifter circuit 200B is a variation of phase shifter circuit 200A of FIG. 2A, and similar detailed description is therefore omitted. In comparison with phase shifter circuit 200A, phase shifter circuit 200B includes PMOS transistors (e.g., transistors 202b and 204b).

Phase shifter circuit 200B is an embodiment of phase shifter circuit 100 of FIG. 1. Phase shifter circuit 200B comprises a transistor 202b and a transistor 204b.

Transistor 202b is an embodiment of resistor R1 of FIG. 1, and similar detailed description is omitted. Transistor 204b is an embodiment of capacitor C1 of FIG. 1, and similar detailed description is omitted.

Transistor 202b and transistor 204b are P-type transistors. In some embodiments, at least transistor 202b or transistor 204b is an NMOS transistor.

A gate terminal of transistor 202b is configured to receive signal VG. A drain terminal of transistor 202b is coupled to input terminal IN. A source terminal of transistor 202b is coupled to the output terminal OUT and a source terminal of transistor 204b. In some embodiments, transistor 202b is configured as resistor R1 of FIG. 1.

A gate terminal of transistor 204b is configured to receive signal $V_{PODE}$. In some embodiments, transistor 204b is configured as capacitor C1 of FIG. 1. Transistor 204b does not include a drain terminal. In some embodiments, transistor 204b includes a drain terminal (not shown), but the drain terminal is electrically floating. In some embodiments, transistor 204a or 204b is implemented by a poly on oxide diffusion edge (PODE).

In some embodiments, at least transistor 202a, 202b, 204a or 204b is a Fin Field Effect Transistor (FinFET). Other types of transistors or numbers of transistors in phase shifter circuit 200B are within the contemplated scope of the present disclosure.

Layout Design of Phase Shifter Circuit

Figure 3:
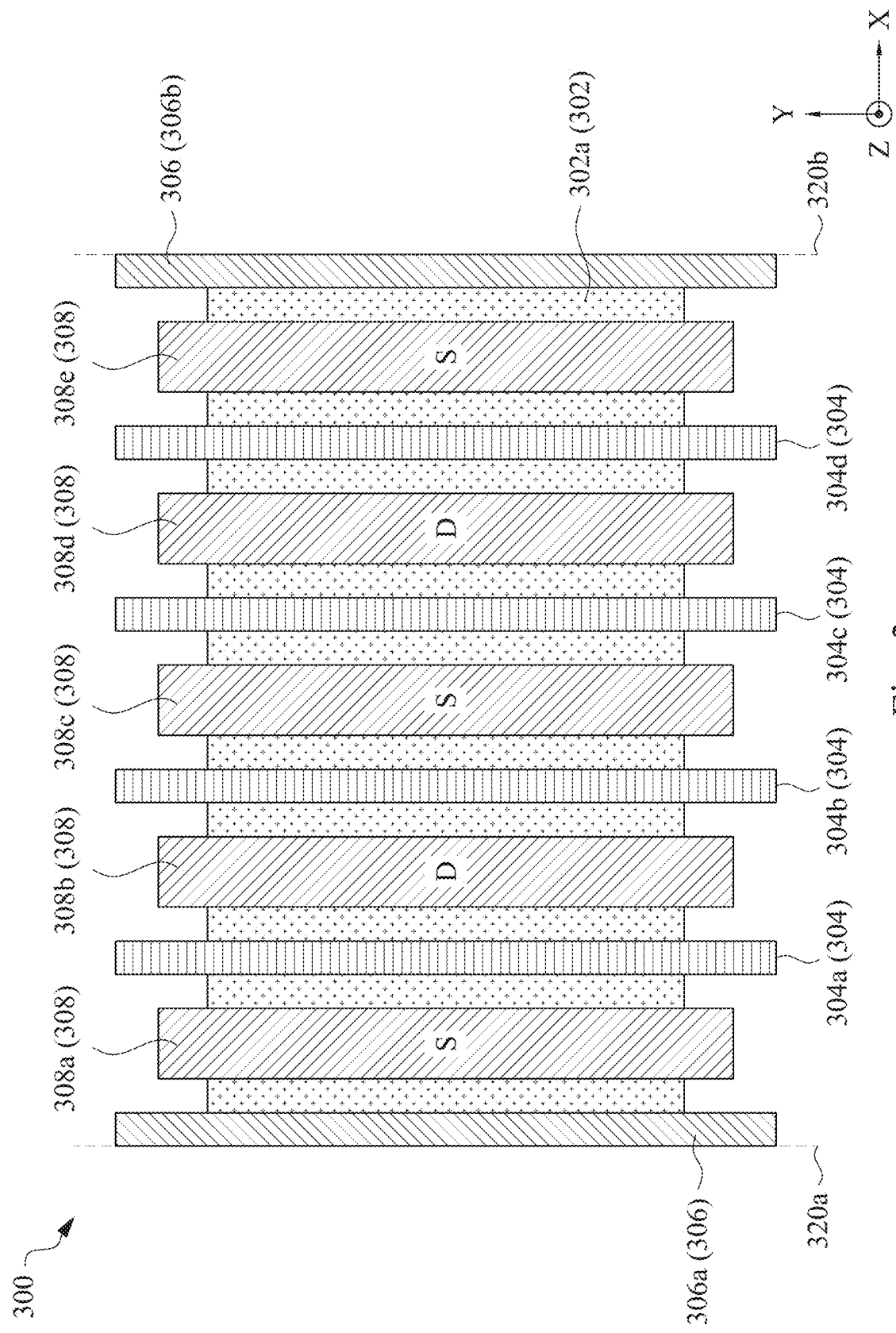
FIG. 3 is a diagram of a layout design, in accordance with some embodiments.

FIG. 3 is a diagram of a layout design 300, in accordance with some embodiments. Layout design 300 is a layout diagram of a phase shifter circuit 200A of FIG. 2A or phase shifter circuit 200B of FIG. 2B.

Figure 4A:
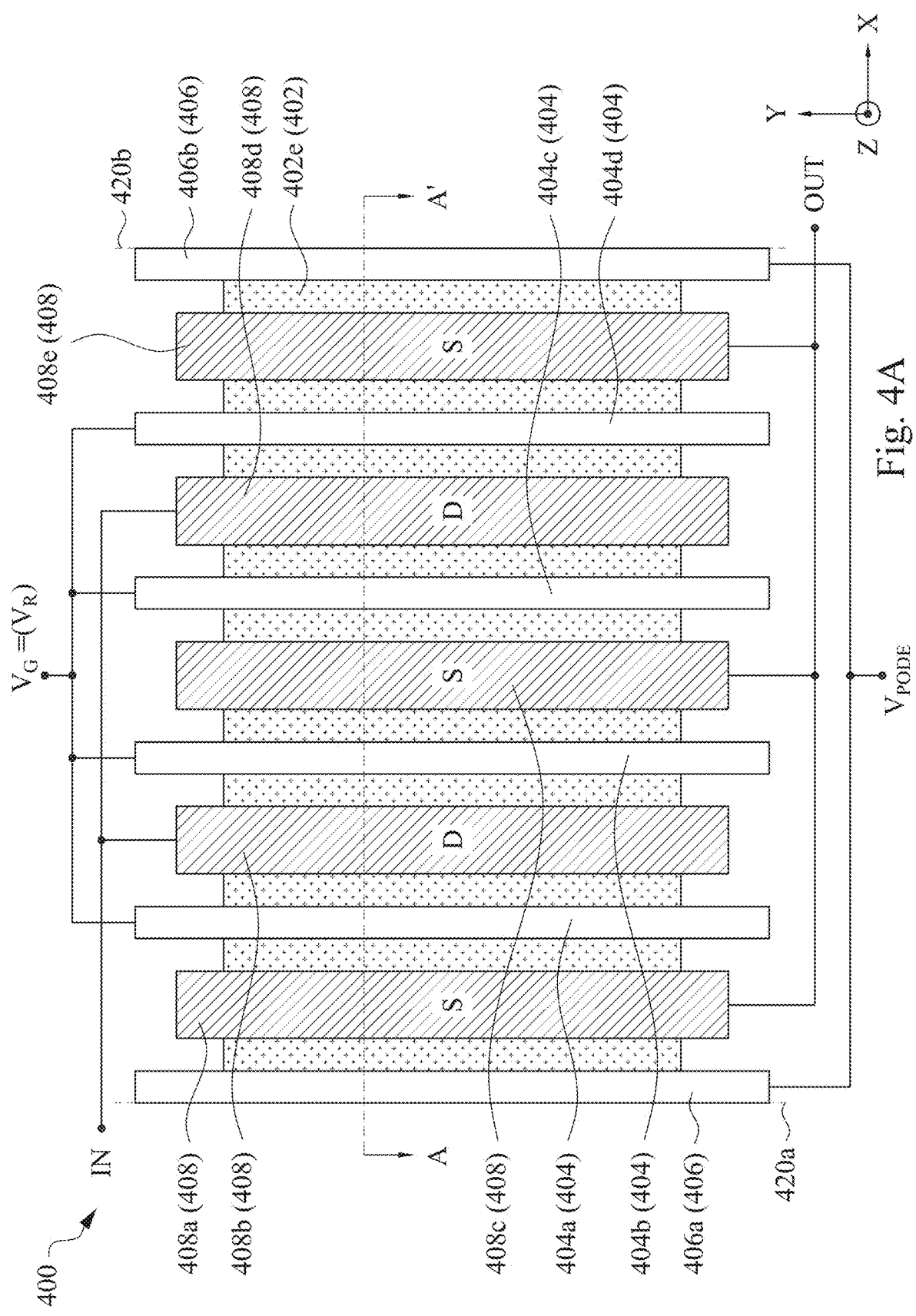
FIGS. 4A and 4B are schematic diagrams of a phase shifter circuit, in accordance with some embodiments.
Figure 4B:
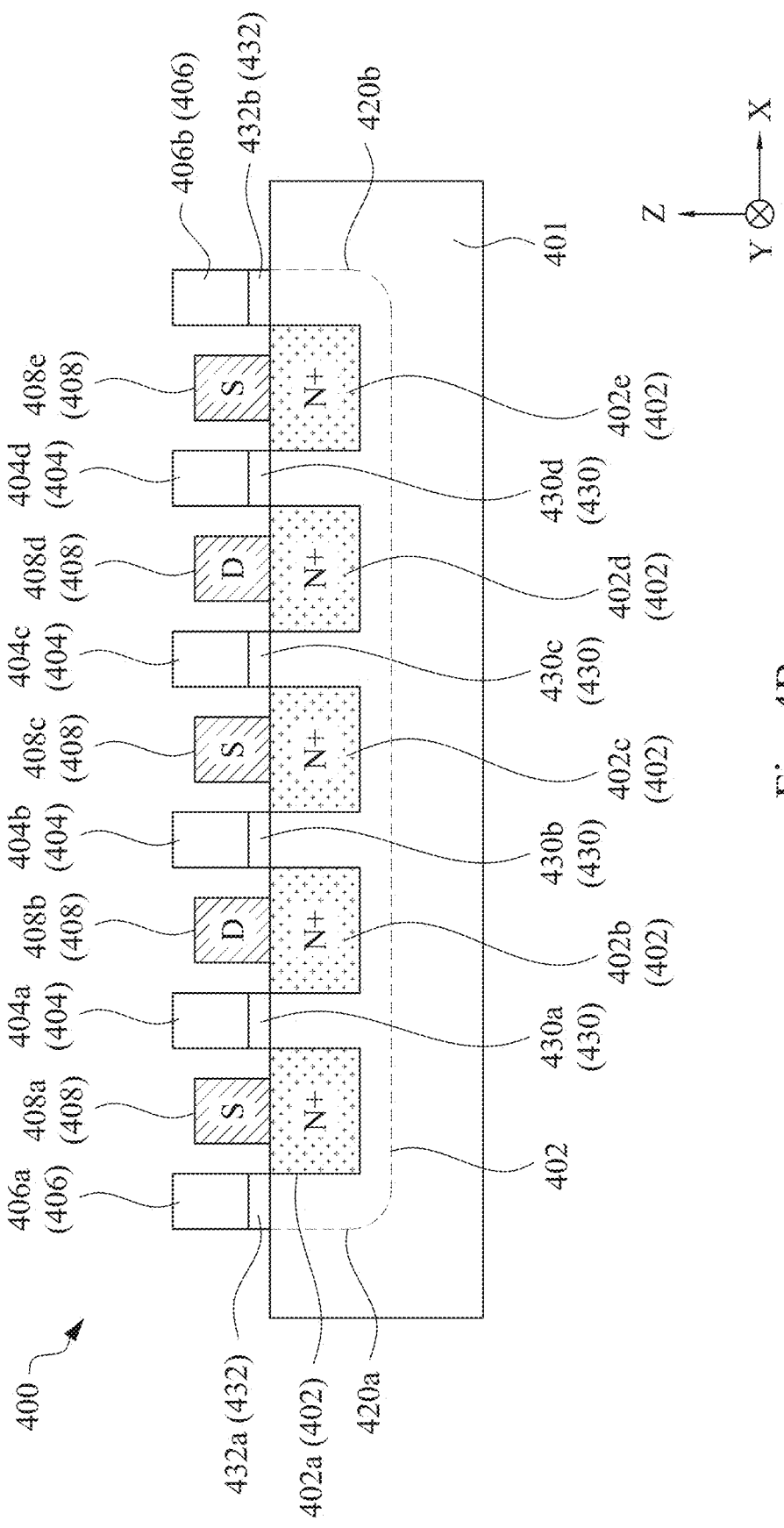
Figure 5B:
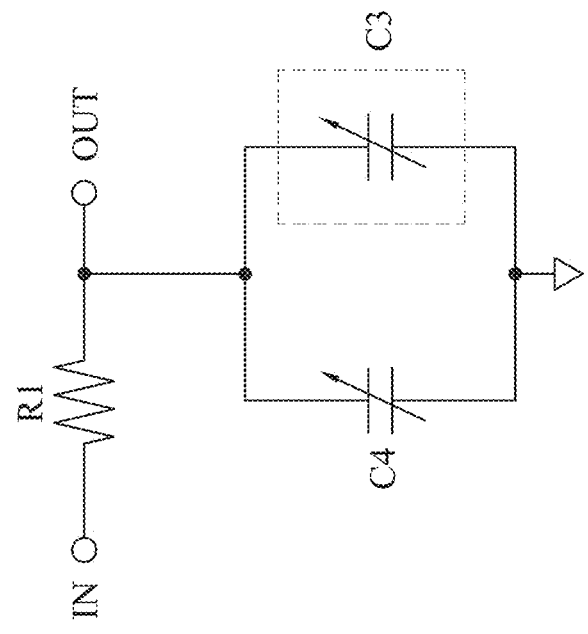
FIG. 5B is a circuit diagram of a phase shifter circuit, in accordance with some embodiments.
Figure 5A:
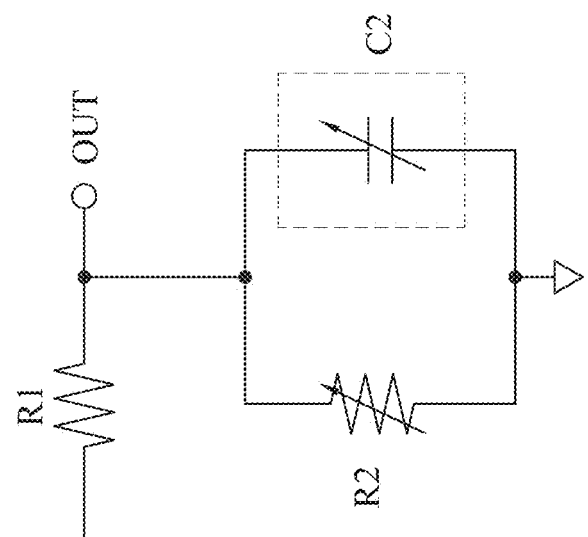
FIG. 5A is a circuit diagram of a phase shifter circuit, in accordance with some embodiments.
Figure 6B:
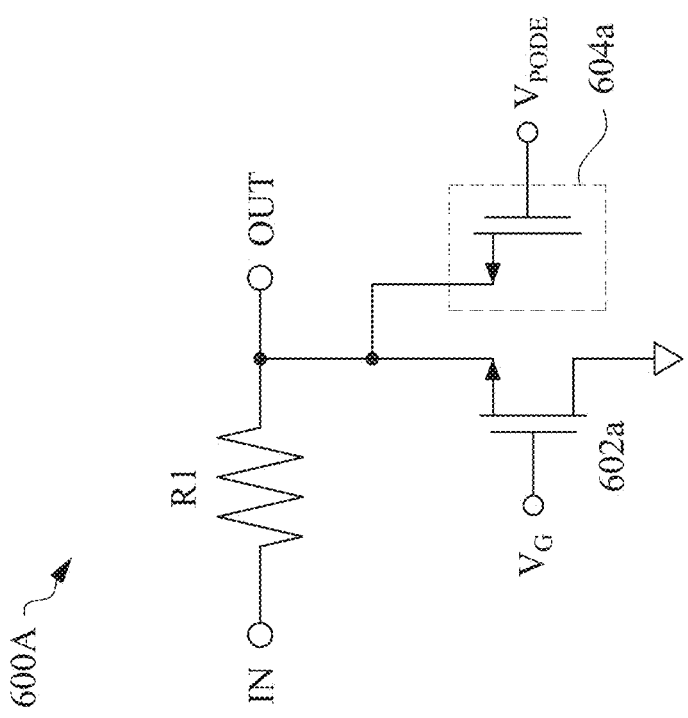
FIG. 6B is a circuit diagram of a phase shifter circuit, in accordance with some embodiments.
Figure 6A:
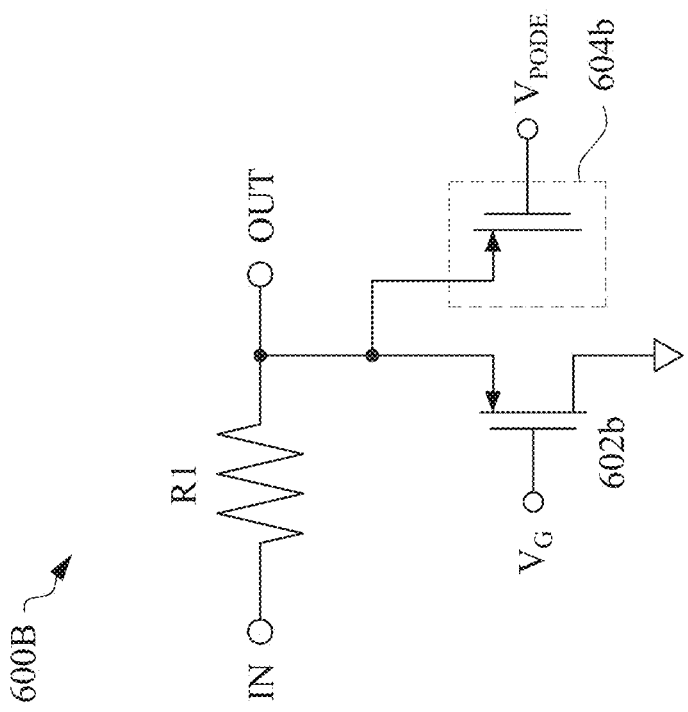
FIG. 6A is a circuit diagram of a phase shifter circuit, in accordance with some embodiments.
Figure 7:
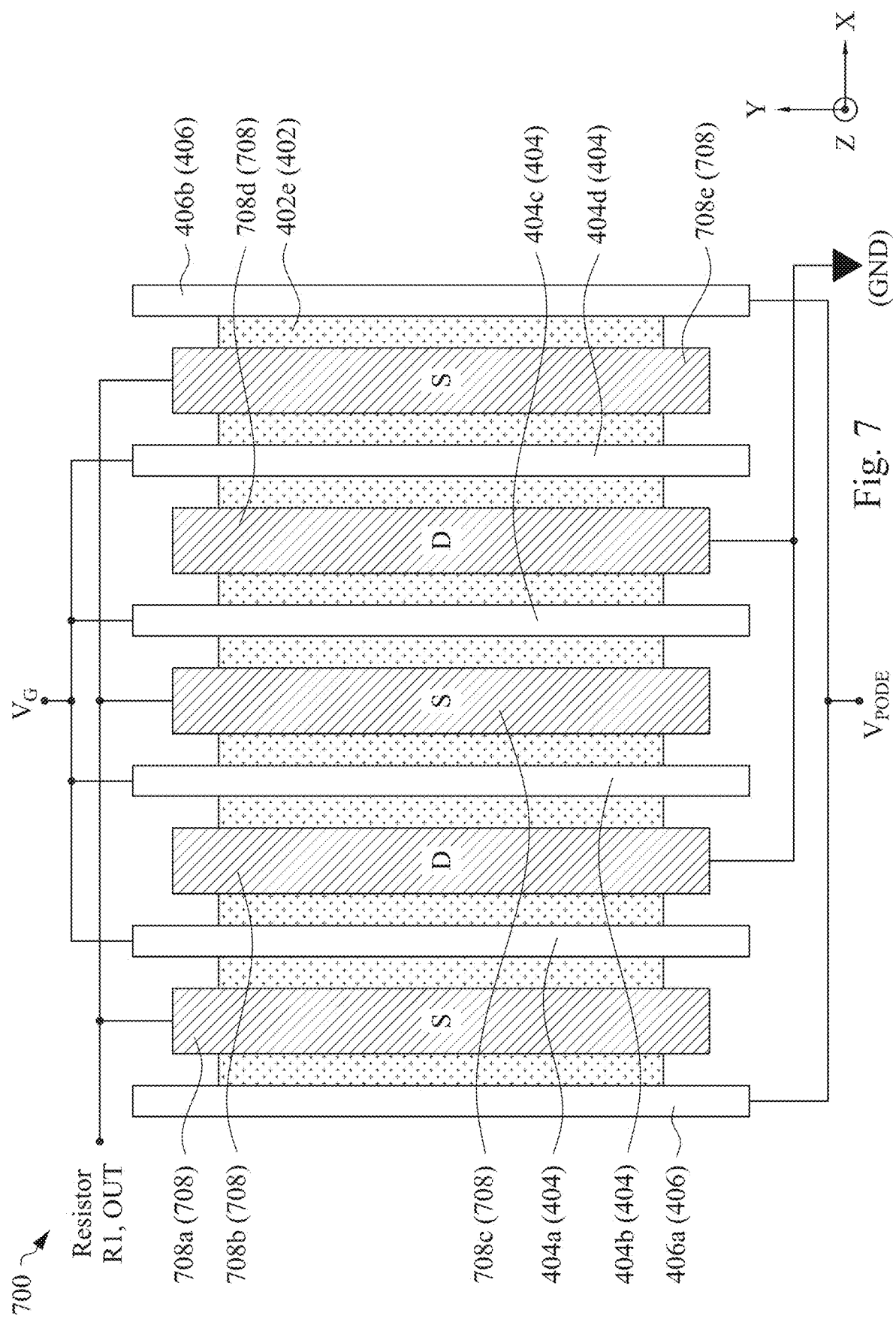
FIG. 7 is a schematic diagram of a top view of phase shifter circuit, in accordance with some embodiments.
Figures 8A, 8B:
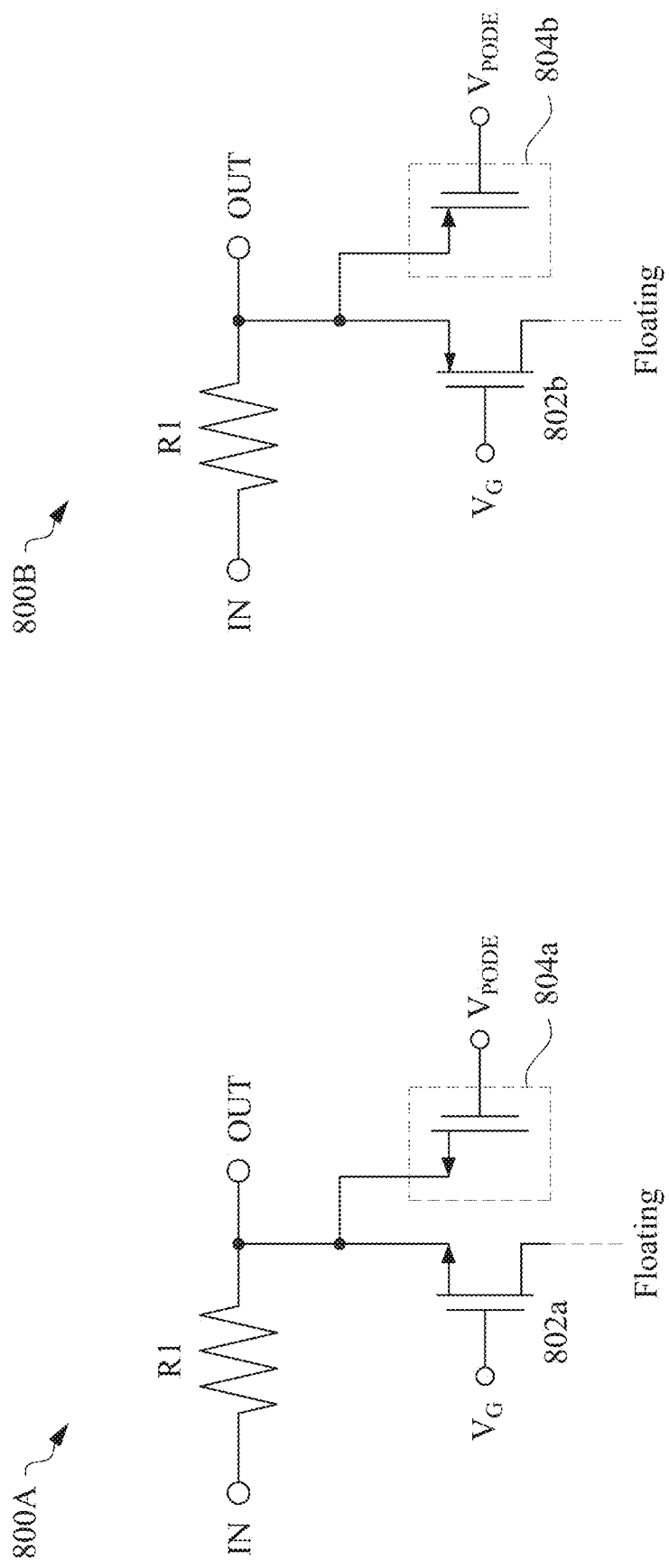
FIG. 8A is a circuit diagram of a phase shifter circuit, in accordance with some embodiments.
FIG. 8B is a circuit diagram of a phase shifter circuit, in accordance with some embodiments.
Figure 9:
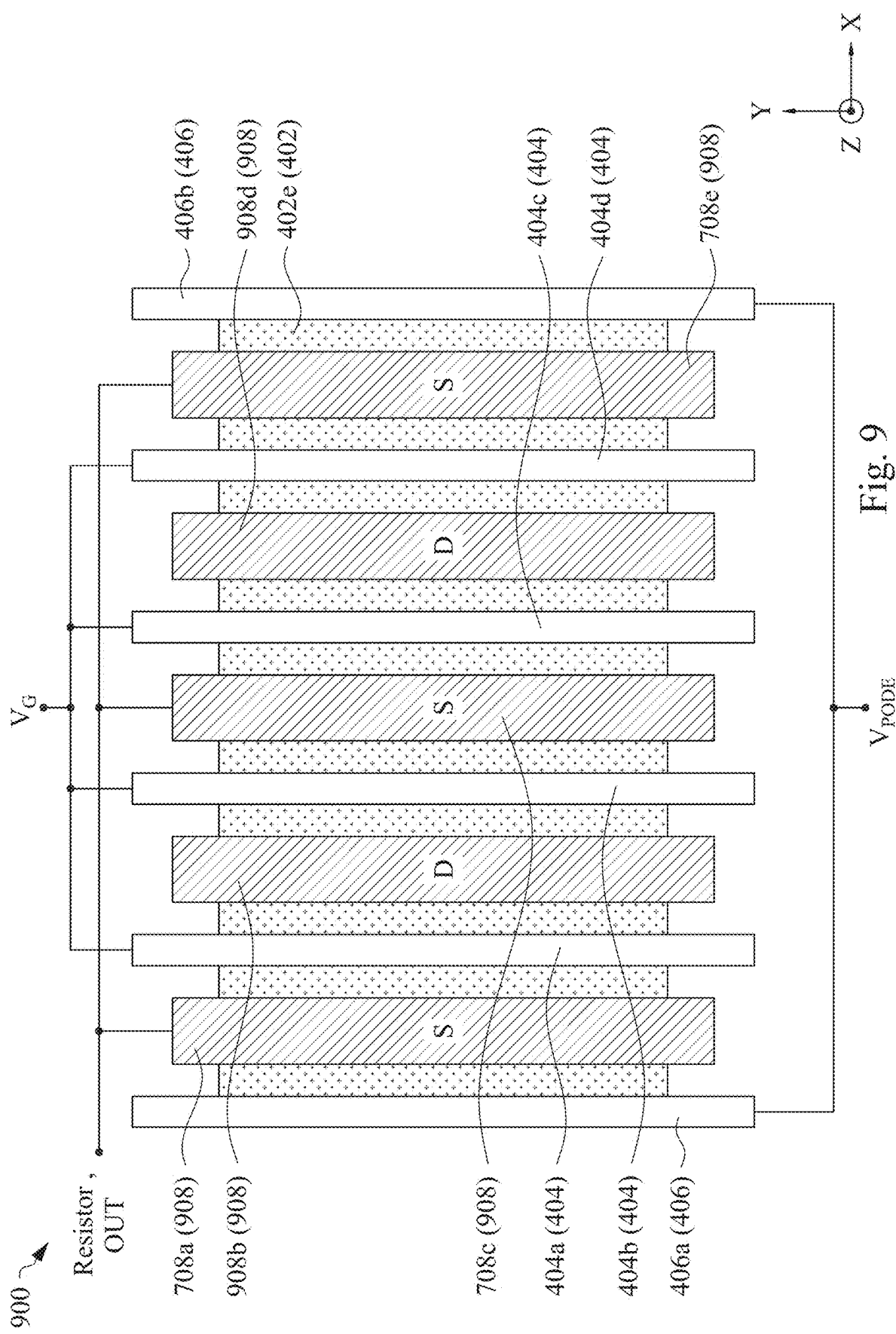
FIG. 9 is a schematic diagram of a top view of phase shifter circuit, in accordance with some embodiments.

Layout design 300 is usable to manufacture one or more of phase shifter circuit 200A-200B, phase shifter circuit 400 of FIGS. 4A-4B, phase shifter circuits 500A-500B of corresponding FIGS. 5A-5B, phase shifter circuits 600A-600B of corresponding FIGS. 6A-6B, phase shifter circuit 700 of FIG. 7, phase shifter circuits 800A-800B of corresponding FIGS. 8A-8B or phase shifter circuit 900 of FIG. 9. In some embodiments, layout design 300 of FIG. 3 includes additional layers or additional layout patterns (e.g., fin layout patterns, upper metal layout patterns, via layout patterns or the like) not shown for simplicity.

Layout design 300 includes a set of active region layout patterns 302 extending in a first direction X. Set of active region layout patterns 302 includes active region layout pattern 302a. The set of active region layout patterns 302 is usable to manufacture a corresponding set of active regions 402 (FIGS. 4A-4B, 7 and 9) of integrated circuit 400, 700 and 900. In some embodiments, the set of active region layout patterns 302 is located on a first layout level. In some embodiments, the set of active region layout patterns 302 is referred to as an oxide diffusion (OD) layout pattern. In some embodiments, the first layout level is the active level or OD level of layout design 300. Other configurations or numbers of active region layout patterns in the set of active region layout patterns 302 are within the scope of the present disclosure.

Layout design 300 further includes a set of gate layout patterns 304 extending in a second direction Y different from the first direction X. The set of gate layout patterns 304 is usable to manufacture a corresponding set of gates 404 (FIGS. 4A-4B, 7 and 9) of integrated circuit 400, 700 and 900. The set of gate layout patterns 304 includes one or more of gate layout patterns 304a, 304b, 304c or 304d. Gate layout pattern 304a, 304b, 304c or 304d of the set of gate layout patterns 304 is usable to manufacture a corresponding gate 404a, 404b, 404c or 404d of the set of gates 404 (FIGS. 4A-4B, 7 and 9) of integrated circuit 400, 700 and 900. Each gate layout pattern of the set of gate layout patterns 304 is separated from another gate layout pattern of the set of gate layout patterns 304 in the first direction X by a first pitch (not labelled).

The set of gate layout patterns 304 overlap the set of active region layout patterns 302 and is located at a second layout level different from the first layout level. In some embodiments, the second layout level is the POLY level.

Layout design 300 further includes a set of gate layout patterns 306 extending in the second direction Y. The set of gate layout patterns 306 is usable to manufacture a corresponding set of gates 406 (FIGS. 4A-4B, 7 and 9) of integrated circuit 400, 700 and 900. The set of gate layout patterns 306 includes one or more of gate layout patterns 306a or 306b. Gate layout pattern 306a, 306b of the set of gate layout patterns 306 is usable to manufacture a corresponding gate 406a, 406b of the set of gates 406 (FIGS. 4A-4B, 7 and 9) of integrated circuit 400, 700 and 900.

Gate layout pattern 306a of the set of gate layout patterns 306 is separated from gate layout pattern 306b of the set of gate layout patterns 306 in the first direction X. In some embodiments, gate layout pattern 306a, 306b of the set of gate layout patterns 306 is separated from corresponding gate layout pattern 304a, 304d of the set of gate layout patterns 304 in the first direction X by the first pitch (not labelled).

The set of gate layout patterns 306 overlap the set of active region layout patterns 302 and is located at the second layout level.

The set of gate layout patterns 306 is positioned along or overlaps opposite edges of active region layout pattern 302a. Gate layout pattern 306a of the set of gate layout patterns 306 is positioned along or overlaps an edge 320a of active region layout pattern 302a. Gate layout pattern 306b of the set of gate layout patterns 306 is positioned along or overlaps an edge 320b of active region layout pattern 302a. In some embodiments, edges 320a and 320b correspond to edges of a standard cell of layout design 300. The set of active region layout patterns 302 is below the set of gate layout patterns 304 and 306. In some embodiments, the set of gate layout patterns 306 is a polysilicon on oxide diffusion edge (PODE) layout pattern. In some embodiments, the gate layout patterns 306 are referred to as dummy gate layout patterns usable to manufacture gates 406a, 406b. However, gates 406a, 406b are not dummy gates as they are functional gates (described in FIGS. 4A-4B).

Gate layout pattern 304b of the set of gate layout patterns 304 is between gate layout pattern 304a and gate layout pattern 304c of the set of gate layout patterns 304. Gate layout pattern 304c of the set of gate layout patterns 304 is between gate layout pattern 304b and gate layout pattern 304d of the set of gate layout patterns 304. Gate layout pattern 304a of the set of gate layout patterns 304 is between gate layout pattern 306a of the set of gate layout patterns 306 and gate layout pattern 304b of the set of gate layout patterns 304. Gate layout pattern 304d of the set of gate layout patterns 304 is between gate layout pattern 306b of the set of gate layout patterns 306 and gate layout pattern 304d of the set of gate layout patterns 304. Other configurations or numbers of gate layout patterns in the set of gate layout patterns 304 or 306 are within the scope of the present disclosure.

Layout design 300 further includes a set of metal over diffusion layout patterns 308 extending in the second direction Y. The set of metal over diffusion layout patterns 308 is usable to manufacture a corresponding set of contacts 408 (FIGS. 4A-4B, 7 and 9) of integrated circuit 400, 700 and 900.

The set of metal over diffusion layout patterns 308 includes one or more metal over diffusion layout patterns 308a, 308b, 308c, 308d or 308e. Metal over diffusion layout pattern 308a, 308b, 308c, 308d, 308e of the set of metal over diffusion layout patterns 308 is usable to manufacture a corresponding contact 408a, 408b, 408c, 408d, 408e of the set of contacts 408 (FIGS. 4A-4B, 7 and 9) of integrated circuit 400, 700 and 900.

In some embodiments, at least metal over diffusion layout patterns 308a, 308c or 308e of the set of metal over diffusion layout patterns 308 are source region layout patterns usable to manufacture source terminals of transistor 202a, 202b, 602a, 602b, 802a, 802b (FIGS. 2A-2B, 6A-6B, 8A-8B) or transistor 204a, 204b, 604a, 604b, 804a, 804b (FIGS. 2A-2B, 6A-6B, 8A-8B).

In some embodiments, at least metal over diffusion layout patterns 308b or 308d of the set of metal over diffusion layout patterns 308 are drain region layout patterns usable to manufacture drain terminals of transistor 202a, 202b, 602a, 602b, 802a, 802b (FIGS. 2A-2B, 6A-6B, 8A-8B) or transistor 204a, 204b, 604a, 604b, 804a, 804b (FIGS. 2A-2B, 6A-6B, 8A-8B).

The set of metal over diffusion layout patterns 308 overlaps the set of active region layout patterns 302 and is located at a third layout level different from the first layout level and the second layout level. In some embodiments, the third layout level is the metal over diffusion (MD) level.

The set of metal over diffusion layout patterns 308 is positioned between the set of gate layout patterns 306. Each of the layout patterns of the set of metal over diffusion layout patterns 308 is separated from an adjacent layout pattern of the set of metal over diffusion layout patterns 308 in the first direction X.

Metal over diffusion layout pattern 308a of the set of metal over diffusion layout patterns 308 is positioned between gate layout pattern 306a of the set of gate layout patterns 306 and gate layout pattern 304a of the set of gate layout patterns 304. Metal over diffusion layout pattern 308b of the set of metal over diffusion layout patterns 308 is positioned between gate layout pattern 304b of the set of gate layout patterns 304 and gate layout pattern 304a of the set of gate layout patterns 304. Metal over diffusion layout pattern 308c of the set of metal over diffusion layout patterns 308 is positioned between gate layout pattern 304b of the set of gate layout patterns 304 and gate layout pattern 304c of the set of gate layout patterns 304. Metal over diffusion layout pattern 308d of the set of metal over diffusion layout patterns 308 is positioned between gate layout pattern 304c of the set of gate layout patterns 304 and gate layout pattern 304d of the set of gate layout patterns 304. Metal over diffusion layout pattern 308e of the set of metal over diffusion layout patterns 308 is positioned between gate layout pattern 306b of the set of gate layout patterns 306 and gate layout pattern 304d of the set of gate layout patterns 304.

Other configurations or numbers of metal over diffusion layout patterns in the set of metal over diffusion layout patterns 308 are within the scope of the present disclosure.

Top View of Phase Shifter Circuit

FIGS. 4A and 4B are schematic diagrams of a phase shifter circuit 400, in accordance with some embodiments.

FIG. 4A is a schematic diagram of a top view of phase shifter circuit 400, in accordance with some embodiments. FIG. 4B is a cross-sectional view of phase shifter circuit 400 as intersected by plane A-A', in accordance with some embodiments.

Phase shifter circuit 400 is an embodiment of phase shifter circuit 200A or 200B of FIG. 2A or 2B expressed in a top view.

Components that are the same or similar to those in one or more of FIGS. 1A-1B, 2A-2B, 4A-4B, 5A-5B, 6A-6B, 7, 8A-8B and 9 (shown below) are given the same reference numbers, and similar detailed description thereof is thus omitted.

Phase shifter circuit 400, phase shifter circuit 700 (FIG. 7) and phase shifter circuit 900 (FIG. 9) are manufactured by layout design 300. Structural relationships including alignment, lengths and widths, as well as configurations of phase shifter circuit 400, 700 and 900 are similar to the structural relationships and configurations of layout design 300 of FIG. 3, and will not be described in each of FIGS. 4, 7 and 9 for brevity.

Phase shifter circuit 400 includes an input terminal IN configured to receive the input signal Vin, and an output terminal OUT configured to output the output signal Vout. The output signal Vout of phase shifter circuit 400 has a phase difference $\Delta\Theta_1$ relative to the input signal Vin as expressed by formula 1.

Phase shifter circuit 400 further includes one or more implant regions 402a, 402b, 402c, 402d or 402e within a well 401. The well 401 includes a first dopant type. The first dopant type is a p-type dopant impurity. In some embodiments, the first dopant type is an n-type dopant impurity. The well 201 is in a substrate (not shown). The well 201 extends in the second direction Y. Other configurations or quantities of well 401 are within the contemplated scope of the present disclosure.

Each implant region 402a, 402b, 402c, 402d, 402e extends in the second direction Y and is separated from each other in the first direction X. Each implant region 402a, 402b, 402c, 402d, 402e has a second dopant type different from the first dopant type. The second dopant type is an n-type dopant impurity. In some embodiments, the second dopant type is a p-type dopant impurity. In some embodiments, implant regions 402a, 402c and 402e are source regions of transistors 202a and 204a or transistors 202a and 204a. In some embodiments, implant regions 402b and 402d are drain regions of transistors 202a and 204a or transistors 202a and 204a. Other configurations or quantities of implant regions 402a, 402b, 402c, 402d and 402e are within the contemplated scope of the present disclosure.

In some embodiments, implant regions 402a, 402b, 402c, 402d and 402e and upper portions of the well 401 are referred to as the set of active regions 402 (hereinafter referred to as "active region 402") of phase shifter circuit 400. Active region 402 extends in the first direction X and is located at a first level of phase shifter circuit 400. In some embodiments, the first level is the active or OD level. Other configurations or quantities of active region 402 are within the contemplated scope of the present disclosure.

Phase shifter circuit 400 further includes a set of gates 404 extending in the second direction Y, overlapping the active region 402, and being located at a second level different from the first level. In some embodiments, the second level is the POLY level. The set of gates 404 includes one or more of gates 404a, 404b, 404c or 404d. In some embodiments, each gate of the set of gates 404 is separated from another gate of the set of gates 404 in the first direction X by the first pitch (not labelled). In some embodiments, one or more gates of the set of gates 404 is a metal gate structure.

In some embodiments, the set of gates 404 correspond to the gate of transistor 202a of FIG. 2A or the gate of transistor 202b of FIG. 2B. In some embodiments, the set of gates 404 are configured to receive a voltage VG. In some embodiments, transistor 202a or transistor 202b is configured to adjust a resistance R1 (shown in FIGS. 1A-1B) of the phase shifter circuit 400 responsive to the voltage VG. In some embodiments, gates 404a, 404b, 404c and 404d of the set of gates 404 are coupled to each other, are configured to receive voltage VG, and are part of transistor 202a or transistor 202b. Other configurations or quantities of set of gates 404 are within the contemplated scope of the present disclosure.

Phase shifter circuit 400 further includes a set of gates 406 extending in the second direction Y, overlapping the set of active regions 402 and being located at the second level.

The set of gates 406 includes one or more of gates 406a or 406b. In some embodiments, each gate of the set of gates 406 is separated from another gate of the set of gates 406 in the first direction X. In some embodiments, one or more gates of the set of gates 406 is a polysilicon gate structure. The set of gates 406 are positioned along opposite edges 420a, 420b of a cell defined by active region 402, and are therefore referred to as POLY on oxide definition edge (PODE).

In some embodiments, the gates 404a, 404b, 404c and 404d of the set of gates 404 are referred to as functional or operational gate structures of phase shifter circuit 400. In some embodiments, phase shifter circuit 400 defines a cell region manufactured by a standard cell layout (e.g., layout design 300), and the cell region is adjacent to additional cells (similar to the cell region of phase shifter circuit 400).

In some embodiments, gates 406a and 406b of the set of gates 406 are configured to cover and protect the ends of the active region 402 or the cell region of phase shifter circuit 400 during manufacturing or processing, thereby providing additional reliability during processing. In some approaches, gates similar to gates 406a and 406b are referred to as "dummy gates" since the dummy gates are not functional or operational since they are turned off as they are susceptible to process variations. In these approaches, the dummy gates are not electrically coupled as gates of a transistor and have no electrical function. However, in some embodiments, gates 406a and 406b of the set of gates 406 are configured to be functional or operational as part of transistor 204a of FIG. 2A or the gate of transistor 204b of FIG. 2B. For example, in some embodiments, the set of gates 406 correspond to the gate of transistor 204a of FIG. 2A or the gate of transistor 204b of FIG. 2B. In some embodiments, the set of gates 406 are configured to receive a voltage $V_{PODE}$. In some embodiments, transistor 204a or transistor 204b is configured to adjust a capacitance C1 (shown in FIGS. 1A-1B) of the phase shifter circuit 400 responsive to the voltage $V_{PODE}$. In some embodiments, gates 406a and 406b of the set of gates 406 are coupled to each other, are configured to receive voltage $V_{PODE}$, and are part of transistor 204a or transistor 204b.

In some embodiments, by adjusting the voltage $V_{PODE}$ received by gates 406a and 406b causes the capacitance C1 of the phase shifter circuit 400 to be adjusted thereby causing a tuning or change of the phase $PHI_{OUT}$ of the output signal OUT relative to the phase $PHI_{IN}$ of the input signal Vin. In some embodiments, the phase $PHI_{OUT}$ of the output signal is changed with respect to the phase $PHI_{IN}$ of the input signal IN by a first phase difference $\Delta PHI_1$. In some embodiments, the first phase difference $\Delta PHI_1$ ranges from about 0 degrees to about 360 degrees.

Similarly, in some embodiments, by adjusting the voltage VG received by gates 408a, 408b, 408c and 408d causes the resistance R1 of the phase shifter circuit 400 to be adjusted thereby causing a tuning or change of the phase $PHI_{OUT}$ of the output signal OUT relative to the phase $PHI_{IN}$ of the input signal Vin. In some embodiments, the phase $PHI_{OUT}$ of the output signal is changed with respect to the phase $PHI_{IN}$ of the input signal IN by a second phase difference $\Delta PHI_2$. In some embodiments, the second phase difference $\Delta PHI_2$ ranges from about 0 degrees to about 360 degrees.

In some embodiments, the first phase difference $\Delta PHI_1$ is referred to as a coarse tuning of the phase $PHI_{IN}$ of input signal Vin. In some embodiments, the second phase difference $\Delta PHI_2$ is referred to as a fine tuning of the phase $PHI_{IN}$ of input signal Vin. In some embodiments, a ratio of the second phase difference $\Delta PHI_2$ to first phase difference $\Delta PHI_1$ ranges from about 1/2 to about 1/5. In some embodiments, a ratio of the fine tuning to the coarse tuning of phase shifter circuit 400 ranges from about 1/2 to about 1/5.

In some embodiments, the first phase difference $\Delta PHI_1$ is larger than the second phase difference $\Delta PHI_2$. In some embodiments, the sum of the coarse tune (e.g., first phase difference $\Delta PHI_1$) and the fine tune (e.g., second phase difference $\Delta PHI_2$) are equal to the phase shift or the phase difference $\Delta \Theta_1$ expressed by formula 1.

Other configurations or quantities of set of gates 406 are within the contemplated scope of the present disclosure.

Phase shifter circuit 400 further includes a set of contacts 408 extending in the second direction Y, being over the active region 402, and being positioned between at least the gates 406a and 406b of the set of gates 406. The set of contacts 408 is located at a third level different from the first level and the second level. In some embodiments, the third level of phase shifter circuit 400 is the MD level.

The set of contacts 408 includes one or more of contacts 408a, 408b, 408c, 408d or 408e. Contact 408a is positioned between gate 406a of the set of gates 406 and gate 404a of the set of gates 404. Contact 408b is positioned between gate 404b of the set of gates 404 and gate 404a of the set of gates 404. Contact 408c is positioned between gate 404b of the set of gates 404 and gate 404c of the set of gates 404. Contact 408d is positioned between gate 404c of the set of gates 404 and gate 404d of the set of gates 404. Contact 408e is positioned between gate 406b of the set of gates 406 and gate 404d of the set of gates 404.

In some embodiments, at least contact 408a, 408c or 408e of the set of contacts 408 are source contacts corresponding to source terminals of transistor 202a, 202b, 602a, 602b, 802a, 802b (FIGS. 2A-2B, 6A-6B, 8A-8B) or transistor 204a, 204b, 604a, 604b, 804a, 804b (FIGS. 2A-2B, 6A-6B, 8A-8B).

In some embodiments, at least contact 408b or 408d of the set of contacts is a drain contact corresponding to drain terminals of transistor 202a, 202b, 602a, 602b, 802a, 802b (FIGS. 2A-2B, 6A-6B, 8A-8B) or transistor 204a, 204b, 604a, 604b, 804a, 804b (FIGS. 2A-2B, 6A-6B, 8A-8B).

In some embodiments, contact 408b, contact 408d and input terminal IN are coupled to each other, and are configured to receive the input signal Vin. In some embodiments, contact 408a, contact 408c, contact 408e and output terminal OUT are coupled to each other, and are configured to output the output signal Vout.

In some embodiments, the active region 402 includes a first source region (e.g., implant region 402a) coupled to contact 408a, a second source region (e.g., implant region 402c) coupled to source contact 408c, a third source region (e.g., implant region 402e) coupled to source contact 408e, a first drain region (e.g., implant region 402b) coupled to contact 408b; and a second drain region (e.g., implant region 402d) coupled to contact 408d. Other configurations or quantities of set of contacts 408 are within the contemplated scope of the present disclosure.

Phase shifter circuit 400 further includes a set of insulating regions 430 and a set of insulating regions 432. The set of insulating regions 430 and the set of insulating regions 432 extend in the second direction Y and are over the active region 402.

Set of insulating regions 430 are positioned between set of gates 404 and active region 402. The set of insulating regions 430 includes one or more of insulating region 430a, 430b, 430c or 430d. Insulating region 430a, 430b, 430c or 430d of the set of insulating regions 430 is below corresponding gate 404a, 404b, 404c or 404d of the set of gates 404. In some embodiments, insulating region 430a, 430b, 430c or 430d of the set of insulating regions 430 is configured to electrically isolate corresponding gate 404a, 404b, 404c or 404d of the set of gates 404 from the active region 402. In some embodiments, each insulating region of the set of insulating regions 430 is separated from another insulating region of the set of insulating regions 430 in the first direction X by the first pitch (not labelled).

Set of insulating regions 432 are positioned between set of gates 406 and active region 402. The set of insulating regions 432 includes one or more of insulating region 432a or 432b. Insulating region 432a or 432b of the set of insulating regions 432 is below corresponding gate 406a or 406b of the set of gates 406. In some embodiments, insulating region 432a or 432b of the set of insulating regions 432 is configured to electrically isolate corresponding gate 406a or 406b of the set of gates 406 from the active region 402. In some embodiments, one or more insulating regions of the set of insulating regions 430 or 432 includes at least a dielectric material, a gate oxide, a high K dielectric, or the like. Other configurations or quantities of set of insulating regions 430 or 432 are within the contemplated scope of the present disclosure.

In some embodiments, phase shifter circuit 400 includes a set of gates 406 located along opposite ends of the active region 402 thereby covering and protecting the ends of the active region 402 or the cell region of phase shifter circuit 400 during manufacturing or processing, thereby providing additional reliability during processing. In some embodiments, by configuring the set of gates 406 to be functional or operational as part of transistor 204a of FIG. 2A or the gate of transistor 204b of FIG. 2B, transistor 204 is configured as a variable capacitor with a capacitance C1 that provides additional tuning to phase shifter circuit 400 in addition to the tuning provided by resistor R1 (e.g., transistor 202a or 202b) compared to other approaches that have a single tuning mechanism.

In some embodiments, by having multiple controls to tune the phase of phase shifter circuit 400, phase shifter circuit 400 has better resolution and a wider adjustable range than other approaches.

In some embodiments, by utilizing set of gates 406 as functional or operational portions of transistors in phase shifter circuit 400, phase shifter circuit 400 is easier to implement and occupies less area than other approaches where dummy gates are not operational and occupy additional space. In some embodiments, phase shifter circuit 400 is not an active phase shifter and therefore has less power dissipation than other approaches.

In some embodiments, each of the advantages of phase shifter circuit 400 described above are also applicable to at least phase shifter circuit 100 (FIG. 1), phase shifter circuit 200A-200B (FIGS. 2A-2B), phase shifter circuit 500A-500B (FIGS. 5A-5B), phase shifter circuit 600A-600B (FIGS. 6A-6B), phase shifter circuit 700 (FIG. 7), phase shifter circuit 800A-800B (FIGS. 8A-8B) or phase shifter circuit 900 (FIG. 9), but are not described herein for brevity.

FIG. 5A is a circuit diagram of a phase shifter circuit 500A, in accordance with some embodiments.

Phase shifter circuit 500A is a variation of phase shifter circuit 100 of FIG. 1, and similar detailed description is therefore omitted. For example, phase shifter circuit 500A illustrates an example of where a variable capacitor (e.g., C2) is coupled in parallel with a variable resistor (e.g., R2).

In comparison with phase shifter circuit 100 of FIG. 1, capacitor C2 and resistor R2 of phase shifter circuit 500A replace capacitor C1, and similar detailed description is therefore omitted.

Each of the second end of resistor R1, a first terminal of capacitor C2, a first end of resistor R2 and the output terminal OUT are coupled to each other. A second terminal of capacitor C2 and a second terminal of resistor R2 are coupled to the reference voltage supply VSS. Other numbers of stages, resistors or capacitors in phase shifter circuit 500A are within the contemplated scope of the present disclosure.

FIG. 5B is a circuit diagram of a phase shifter circuit 500B, in accordance with some embodiments.

Phase shifter circuit 500B is a variation of phase shifter circuit 100 of FIG. 1 or phase shifter circuit 500A of FIG. 5A, and similar detailed description is therefore omitted. For example, phase shifter circuit 500B illustrates an example of where a variable capacitor (e.g., C3) is coupled in parallel with another variable capacitor (e.g., C4).

In comparison with phase shifter circuit 500A of FIG. 5A, capacitor C3 of phase shifter circuit 500B replaces capacitor C2, and capacitor C4 of phase shifter circuit 500B replaces resistor R2, and similar detailed description is therefore omitted.

Each of the second terminal of resistor R1, a first terminal of capacitor C3, a first terminal of capacitor C4 and the output terminal OUT are coupled to each other. A second terminal of capacitor C3 and a second terminal of capacitor C4 are coupled to the reference voltage supply VSS. Other numbers of stages, resistors or capacitors in phase shifter circuit 500B are within the contemplated scope of the present disclosure.

FIG. 6A is a circuit diagram of a phase shifter circuit 600A, in accordance with some embodiments.

Phase shifter circuit 600A is an embodiment of phase shifter circuit 500A of FIG. 5A or phase shifter circuit 100 of FIG. 1.

Phase shifter circuit 600A comprises resistor R1 coupled to a transistor 602a and a transistor 604a. Transistor 602a is an embodiment of resistor R2 of FIG. 5A, and transistor 604a is an embodiment of capacitor C2 of FIG. 5A, and similar detailed description is omitted.

Phase shifter circuit 600A is also a variation of phase shifter circuit 200A of FIG. 2A, and similar detailed description is omitted. For example, transistor 602a is a variation of transistor 202a of FIG. 2A, and transistor 604a is a variation of transistor 204a of FIG. 2A, and similar detailed description is omitted.

Transistor 602a and transistor 604a are NMOS transistors. In some embodiments, at least transistor 602a or transistor 604a is a PMOS transistor.

The input terminal of phase shifter circuit 600A is coupled to the first end of resistor R1, and configured to receive an input signal Vin. The output terminal OUT of phase shifter circuit 600A is configured to output an output signal Vout. Each of the second terminal of resistor R1, the output terminal of phase shifter circuit 600A, a source terminal of transistor 602A and a source terminal of transistor 604A are coupled together.

A gate terminal of transistor 602a is configured to receive the signal VG. A drain terminal of transistor 602a is coupled to reference voltage supply VSS. In some embodiments, transistor 602a is configured as a variable resistor R2 of FIG. 5A.

A gate terminal of transistor 604a is configured to receive the signal $V_{PODE}$. In some embodiments, transistor 604a is configured as a variable capacitor C2 of FIG. 5A. Transistor 604a does not include a drain terminal. In some embodiments, transistor 604a includes a drain terminal (not shown), but the drain terminal is electrically floating.

Other types of transistors or numbers of transistors in phase shifter circuit 600A are within the contemplated scope of the present disclosure.

FIG. 6B is a circuit diagram of a phase shifter circuit 600B, in accordance with some embodiments.

Phase shifter circuit 600B is a variation of phase shifter circuit 600A of FIG. 6A, and similar detailed description is therefore omitted. In comparison with phase shifter circuit 600A, phase shifter circuit 600B includes PMOS transistors (e.g., transistors 602b and 604b). For example, in comparison with phase shifter circuit 600A, transistor 602b of phase shifter circuit 600B replaces transistor 602a and transistor 604b of phase shifter circuit 600B replaces transistor 604a, and similar detailed description is therefore omitted.

Phase shifter circuit 600B is an embodiment of phase shifter circuit 500A of FIG. 5A or phase shifter circuit 100 of FIG. 1.

Transistor 602b and transistor 604b are P-type transistors. In some embodiments, at least transistor 602b or transistor 604b is an NMOS transistor.

In some embodiments, at least transistor 602a, 602b, 604a or 604b is a FinFET. Other types of transistors or numbers of transistors in phase shifter circuit 600B are within the contemplated scope of the present disclosure.

Other types of transistors or numbers of transistors in phase shifter circuit 600B are within the contemplated scope of the present disclosure.

Top View of Phase Shifter Circuit

FIG. 7 is a schematic diagram of a top view of phase shifter circuit 700, in accordance with some embodiments.

In some embodiments, a cross-sectional view of phase shifter circuit 700 of FIG. 7 or phase shifter circuit 900 of FIG. 9 is similar to the cross-sectional view of phase shifter circuit 400 in FIG. 4B, and similar detailed description and depiction are not provided for brevity.

Phase shifter circuit 700 is an embodiment of phase shifter circuit 600A or 600B of FIG. 6A or 6B expressed in a top view.

Phase shifter circuit 700 is a variation of phase shifter circuit 400 of FIGS. 4A-4B, and similar detailed description is therefore omitted. In comparison with phase shifter circuit 400 of FIGS. 4A-4B, set of contacts 708 of phase shifter circuit 700 replaces set of contacts 408, and similar detailed description is therefore omitted.

Set of contacts 708 include one or more of contacts 708a, 708b, 708c, 708d or 708e. In some embodiments, the positioning of contacts 708a, 708b, 708c, 708d or 708e of the set of contacts 708 is similar to corresponding contacts of the set of contacts 408 of FIGS. 4A-4B, and similar detailed description is therefore omitted for brevity.

In some embodiments, at least contact 708a, 708c or 708e of the set of contacts 708 are source contacts corresponding to source terminals of transistor 602a, 602b, 802a, 802b (FIGS. 2A-2B, 6A-6B, 8A-8B) or transistor 604a, 604b, 804a, 804b (FIGS. 2A-2B, 6A-6B, 8A-8B).

In some embodiments, at least contact 708b or 708d of the set of contacts is a drain contact corresponding to drain terminals of transistor 602a, 602b, 802a, 802b (FIGS. 2A-2B, 6A-6B, 8A-8B) or transistor 604a, 604b, 804a, 804b (FIGS. 2A-2B, 6A-6B, 8A-8B).

In comparison with phase shifter circuit 400 of FIGS. 4A-4B, contact 708b and contact 708d are not coupled to the input terminal IN. In some embodiments, contact 708b and contact 708d are coupled to the reference voltage supply VSS (e.g., ground).

In comparison with phase shifter circuit 400 of FIGS. 4A-4B, contact 708a, contact 708c, contact 708e and output terminal OUT are coupled to each other, and further coupled to the resistor R1 (not shown). In some embodiments, a schematic diagram of a top view of resistor R1 is similar to the top view of transistor 202a or 202b of FIG. 4A, and similar detailed description is therefore omitted.

In some embodiments, the active region 402 includes a first source region (e.g., implant region 402a) coupled to contact 708a, a second source region (e.g., implant region 402c) coupled to source contact 708c, a third source region (e.g., implant region 402e) coupled to source contact 708e, a first drain region (e.g., implant region 402b) coupled to contact 708b; and a second drain region (e.g., implant region 402d) coupled to contact 708d. Other configurations or quantities of set of contacts 708 are within the contemplated scope of the present disclosure.

In some embodiments, the set of gates 404 of phase shifter circuit 700 of FIG. 7 correspond to the gate of transistor 602a of FIG. 6A or the gate of transistor 602b of FIG. 6B. In some embodiments, transistor 602a or transistor 602b is configured to adjust a resistance R2 (FIG. 5A) of the phase shifter circuit 700 responsive to the voltage VG. In some embodiments, gates 404a, 404b, 404c and 404d of the set of gates 404 of FIG. 7 are coupled to each other, are configured to receive voltage VG, and are part of transistor 602a or transistor 602b. Other configurations or quantities of set of gates 404 of FIG. 7 are within the contemplated scope of the present disclosure.

In some embodiments, gates 406a and 406b of the set of gates 406 of phase shifter circuit 700 of FIG. 7 are configured to be functional or operational as part of transistor 604a of FIG. 6A or the gate of transistor 604b of FIG. 6B. For example, in some embodiments, the set of gates 406 of FIG. 7 correspond to the gate of transistor 604a of FIG. 6A or the gate of transistor 604b of FIG. 6B. In some embodiments, the set of gates 406 of FIG. 7 are configured to receive a voltage $V_{PODE}$ In some embodiments, transistor 604a or transistor 604b is configured to adjust a capacitance C2 (FIG. 5A) of the phase shifter circuit 700 responsive to the voltage $V_{PODE}$ In some embodiments, gates 406a and 406b of the set of gates 406 of FIG. 7 are coupled to each other, are configured to receive voltage $V_{PODE}$, and are part of transistor 604a or transistor 604b.

In some embodiments, by adjusting the voltage $V_{PODE}$ received by gates 406a and 406b of phase shifter circuit 700 of FIG. 7 causes the capacitance C2 of the phase shifter circuit 700 to be adjusted thereby causing a tuning or change of the phase $PHI_{OUT}$ of the output signal OUT of phase shifter circuit 700 relative to the phase $PHI_{IN}$ of the input signal Vin. In some embodiments, the phase $PHI_{OUT}$ of the output signal of phase shifter circuit 700 is changed with respect to the phase $PHI_{IN}$ of the input signal IN by a third phase difference $\Delta PHI_3$. In some embodiments, the third phase difference $\Delta PHI_3$ ranges from about 0 degrees to about 360 degrees.

Similarly, in some embodiments, by adjusting the voltage VG received by gates 408a, 408b, 408c and 408d of phase shifter circuit 700 of FIG. 7 causes the resistance R2 of phase shifter circuit 700 to be adjusted thereby causing a tuning or change of the phase $PHI_{OUT}$ of the output signal OUT of phase shifter circuit 700 relative to the phase $PHI_{IN}$ of the input signal Vin. In some embodiments, the phase $PHI_{OUT}$ of the output signal of phase shifter circuit 700 is changed with respect to the phase $PHI_{IN}$ of the input signal IN by a fourth phase difference $\Delta PHI_4$. In some embodiments, the fourth phase difference $\Delta PHI_4$ ranges from about 0 degrees to about 360 degrees.

In some embodiments, the third phase difference $\Delta PHI_3$ is referred to as a coarse tuning of the phase $PHI_{IN}$ of input signal Vin of phase shifter circuit 700. In some embodiments, the fourth phase difference $\Delta PHI_4$ is referred to as a fine tuning of the phase $PHI_{IN}$ of input signal Vin of phase shifter circuit 700. In some embodiments, a ratio of the fourth phase difference $\Delta PHI_4$ to third phase difference $\Delta PHI_3$ ranges from about 1/2 to about 1/5. In some embodiments, a ratio of the fine tuning to the coarse tuning of phase shifter circuit 700 ranges from about 1/2 to about 1/5.

In some embodiments, the third phase difference $\Delta PHI_3$ is larger than the fourth phase difference $\Delta PHI_4$. In some embodiments, the third phase difference $\Delta PHI_3$ is less than the fourth phase difference $\Delta PHI_4$. In some embodiments, the sum of the coarse tune (e.g., third phase difference $\Delta PHI_3$) and the fine tune (e.g., fourth phase difference $\Delta PHI_4$) are equal to the phase shift or the phase difference $\Delta \Theta_1$ expressed by formula 1.

Other configurations or quantities of set of gates 406 of FIG. 7 are within the contemplated scope of the present disclosure.

FIG. 8A is a circuit diagram of a phase shifter circuit 800A, in accordance with some embodiments.

Phase shifter circuit 800A is an embodiment of phase shifter circuit 500B of FIG. 5B or phase shifter circuit 100 of FIG. 1.

Phase shifter circuit 800A comprises resistor R1 coupled to a transistor 802a and a transistor 804a. Transistor 802a is an embodiment of capacitor C4 of FIG. 5B, and transistor 804a is an embodiment of capacitor C3 of FIG. 5B, and similar detailed description is omitted.

Phase shifter circuit 800A is a variation of phase shifter circuit 600A of FIG. 6A, and similar detailed description is omitted. In comparison with phase shifter circuit 600A, transistor 802a replaces transistor 602a, and transistor 804a replaces transistor 604a, and similar detailed description is omitted.

In comparison with phase shifter circuit 600A, a drain of transistor 802a of phase shifter circuit 800A is electrically floating, and is not coupled to reference voltage supply VSS. By configuring the drain of transistor 802a as electrically floating, transistor 802a is configured as a capacitor C4 of FIG. 5B with a variable capacitance responsive to voltage VG. In some embodiments, transistor 804a is configured as a capacitor C3 of FIG. 5B with a variable capacitance responsive to voltage $V_{PODE}$. In some embodiments, a capacitance of capacitor C4 is greater than a capacitance of capacitor C3. In some embodiments, the capacitance of capacitor C4 is less than the capacitance of capacitor C3.

Phase shifter circuit 800A is a variation of phase shifter circuit 200A of FIG. 2A, and similar detailed description is omitted. For example, transistor 802a is a variation of transistor 202a of FIG. 2A, and transistor 804a is a variation of transistor 204a of FIG. 2A, and similar detailed description is omitted.

Transistor 802a and transistor 804a are NMOS transistors. In some embodiments, at least transistor 802a or transistor 804a is a PMOS transistor.

Other types of transistors or numbers of transistors in phase shifter circuit 800A are within the contemplated scope of the present disclosure.

FIG. 8B is a circuit diagram of a phase shifter circuit 800B, in accordance with some embodiments.

Phase shifter circuit 800B is an embodiment of phase shifter circuit 500B of FIG. 5B or phase shifter circuit 100 of FIG. 1.

Phase shifter circuit 800B is a variation of phase shifter circuit 800A of FIG. 8A, and similar detailed description is therefore omitted. In comparison with phase shifter circuit 800A, phase shifter circuit 800B includes PMOS transistors (e.g., transistors 802b and 804b). For example, in comparison with phase shifter circuit 800A, transistor 802b of phase shifter circuit 800B replaces transistor 802a and transistor 804b of phase shifter circuit 800B replaces transistor 804a, and similar detailed description is therefore omitted.

Transistor 802b and transistor 804b are P-type transistors. In some embodiments, at least transistor 802b or transistor 804b is an NMOS transistor.

In some embodiments, at least transistor 802a, 802b, 804a or 804b is a FinFET. Other types of transistors or numbers of transistors in phase shifter circuit 800B are within the contemplated scope of the present disclosure.

Other types of transistors or numbers of transistors in phase shifter circuit 800B are within the contemplated scope of the present disclosure.

Top View of Phase Shifter Circuit

FIG. 9 is a schematic diagram of a top view of phase shifter circuit 900, in accordance with some embodiments.

Phase shifter circuit 900 is an embodiment of phase shifter circuit 800A or 800B of FIG. 8A or 8B expressed in a top view. Phase shifter circuit 900 is a variation of phase shifter circuit 400 of FIGS. 4A-4B and phase shifter circuit 700 of FIG. 7, and similar detailed description is therefore omitted. In comparison with phase shifter circuit 700 of FIG. 7, set of contacts 908 of phase shifter circuit 900 replaces set of contacts 708, and similar detailed description is therefore omitted.

Set of contacts 908 include one or more of contacts 708a, 908b, 708c, 908d or 708e. In some embodiments, the positioning of contacts 708a, 908b, 708c, 908d or 708e of the set of contacts 908 is similar to corresponding contacts of the set of contacts 408 of FIGS. 4A-4B, and similar detailed description is therefore omitted for brevity.

In some embodiments, at least contact 908b or 908d of the set of contacts is a drain contact corresponding to drain terminals of transistor 802a, 802b (FIGS. 8A-8B) or transistor 804a, 804b (FIGS. 8A-8B).

In comparison with phase shifter circuit 700 of FIG. 7, contact 908b of phase shifter circuit 900 and contact 908d of phase shifter circuit 900 are electrically floating, and are not coupled to the reference voltage supply VSS (e.g., ground).

In some embodiments, the active region 402 includes a first source region (e.g., implant region 402a) coupled to contact 708a, a second source region (e.g., implant region 402c) coupled to source contact 708c, a third source region (e.g., implant region 402e) coupled to source contact 708e, a first drain region (e.g., implant region 402b) coupled to contact 908b; and a second drain region (e.g., implant region 402d) coupled to contact 908d. Other configurations or quantities of set of contacts 908 are within the contemplated scope of the present disclosure.

In some embodiments, the set of gates 404 of phase shifter circuit 900 of FIG. 9 correspond to the gate of transistor 802a of FIG. 8A or the gate of transistor 802b of FIG. 8B. In some embodiments, transistor 802a or transistor 802b is configured to adjust a capacitance C4 (FIG. 5B) of the phase shifter circuit 900 responsive to the voltage VG. In some embodiments, gates 404a, 404b, 404c and 404d of the set of gates 404 of FIG. 9 are coupled to each other, are configured to receive voltage VG, and are part of transistor 802a or transistor 802b. Other configurations or quantities of set of gates 404 of FIG. 9 are within the contemplated scope of the present disclosure.

In some embodiments, gates 406a and 406b of the set of gates 406 of phase shifter circuit 900 of FIG. 9 are configured to be functional or operational as part of transistor 804a of FIG. 8A or the gate of transistor 804b of FIG. 8B. For example, in some embodiments, the set of gates 406 of FIG. 8 correspond to the gate of transistor 804a of FIG. 8A or the gate of transistor 804b of FIG. 8B. In some embodiments, the set of gates 406 of FIG. 9 are configured to receive a voltage $V_{PODE}$. In some embodiments, transistor 804a or transistor 804b is configured to adjust a capacitance C3 (FIG. 5B) of the phase shifter circuit 900 responsive to the voltage $V_{PODE}$. In some embodiments, gates 406a and 406b of the set of gates 406 of FIG. 9 are coupled to each other, are configured to receive voltage $V_{PODE}$, and are part of transistor 804a or transistor 804b.

In some embodiments, by adjusting the voltage $V_{PODE}$ received by gates 406a and 406b of phase shifter circuit 900 of FIG. 9 causes the capacitance C3 of the phase shifter circuit 900 to be adjusted thereby causing a tuning or change of the phase $PHI_{OUT}$ of the output signal OUT of phase shifter circuit 900 relative to the phase $PHI_{IN}$ of the input signal Vin. In some embodiments, the phase $PHI_{OUT}$ of the output signal of phase shifter circuit 900 is changed with respect to the phase $PHI_{IN}$ of the input signal IN by a fifth phase difference $\Delta PHI_5$. In some embodiments, the fifth phase difference $\Delta PHI_5$ ranges from about 0 degrees to about 360 degrees.

Similarly, in some embodiments, by adjusting the voltage VG received by gates 408a, 408b, 408c and 408d of phase shifter circuit 900 of FIG. 9 causes the capacitance C4 of phase shifter circuit 900 to be adjusted thereby causing a tuning or change of the phase $PHI_{OUT}$ of the output signal OUT of phase shifter circuit 900 relative to the phase $PHI_{IN}$ of the input signal Vin. In some embodiments, the phase $PHI_{OUT}$ of the output signal of phase shifter circuit 900 is changed with respect to the phase $PHI_{IN}$ of the input signal IN by a sixth phase difference $\Delta PHI_6$. In some embodiments, the sixth phase difference $\Delta PHI_6$ ranges from about 0 degrees to about 360 degrees.

In some embodiments, the fifth phase difference $\Delta PHI_5$ is referred to as a fine tuning of the phase $PHI_{IN}$ of input signal Vin of phase shifter circuit 900. In some embodiments, the sixth phase difference $\Delta PHI_6$ is referred to as a coarse tuning of the phase $PHI_{IN}$ of input signal Vin of phase shifter circuit 900. In some embodiments, a ratio of the sixth phase difference $\Delta PHI_6$ to fifth phase difference $\Delta PHI_5$ ranges from about 1/2 to about 1/5. In some embodiments, a ratio of the fine tuning to the coarse tuning of phase shifter circuit 900 ranges from about 1/2 to about 1/5.

In some embodiments, the fifth phase difference $\Delta PHI_5$ is less than the sixth phase difference $\Delta PHI_6$. In some embodiments, the fifth phase difference $\Delta PHI_5$ is greater than the sixth phase difference $\Delta PHI_6$. In some embodiments, the sum of the fine tune (e.g., fifth phase difference $\Delta PHI_5$) and the coarse tune (e.g., sixth phase difference $\Delta PHI_6$) are equal to the phase shift or the phase difference $\Delta \Theta_1$ expressed by formula 1.

Other configurations or quantities of set of gates 406 of FIG. 9 are within the contemplated scope of the present disclosure.

In some embodiments, phase shifter circuit 400 also includes other structures or layers (e.g., fins, upper metal layers, vias or the like) that are not described for simplicity.

FIGS. 10A-10D illustrate corresponding schematic drawings 1000A-1000D of a phase difference of a phase shifter circuit usable in FIGS. 2A-2B, in accordance with some embodiments.

Schematic drawings 1000A-1000D of corresponding FIGS. 10A-10D include a horizontal axis and a vertical axis. As shown in FIGS. 10A-10D, the horizontal axis shows a range of frequencies of input signal Vin applied to phase shifter circuit 200A, 200B or 400, and the vertical axis shows a range of phase differences (e.g., phase difference $\Delta \Theta_1$ as expressed by formula 1) for phase shifter circuit 200A, 200B or 400.

As shown in FIGS. 10A-10D, corresponding schematic drawings 1000A-1000D show phase characteristics for a voltage VG provided to the gate of transistor 202a or 202b, over a range of voltages $V_{PODE}$ provided to the gate of transistor 204a or 204b, over a range of frequencies of input signal Vin.

Figure 10A:
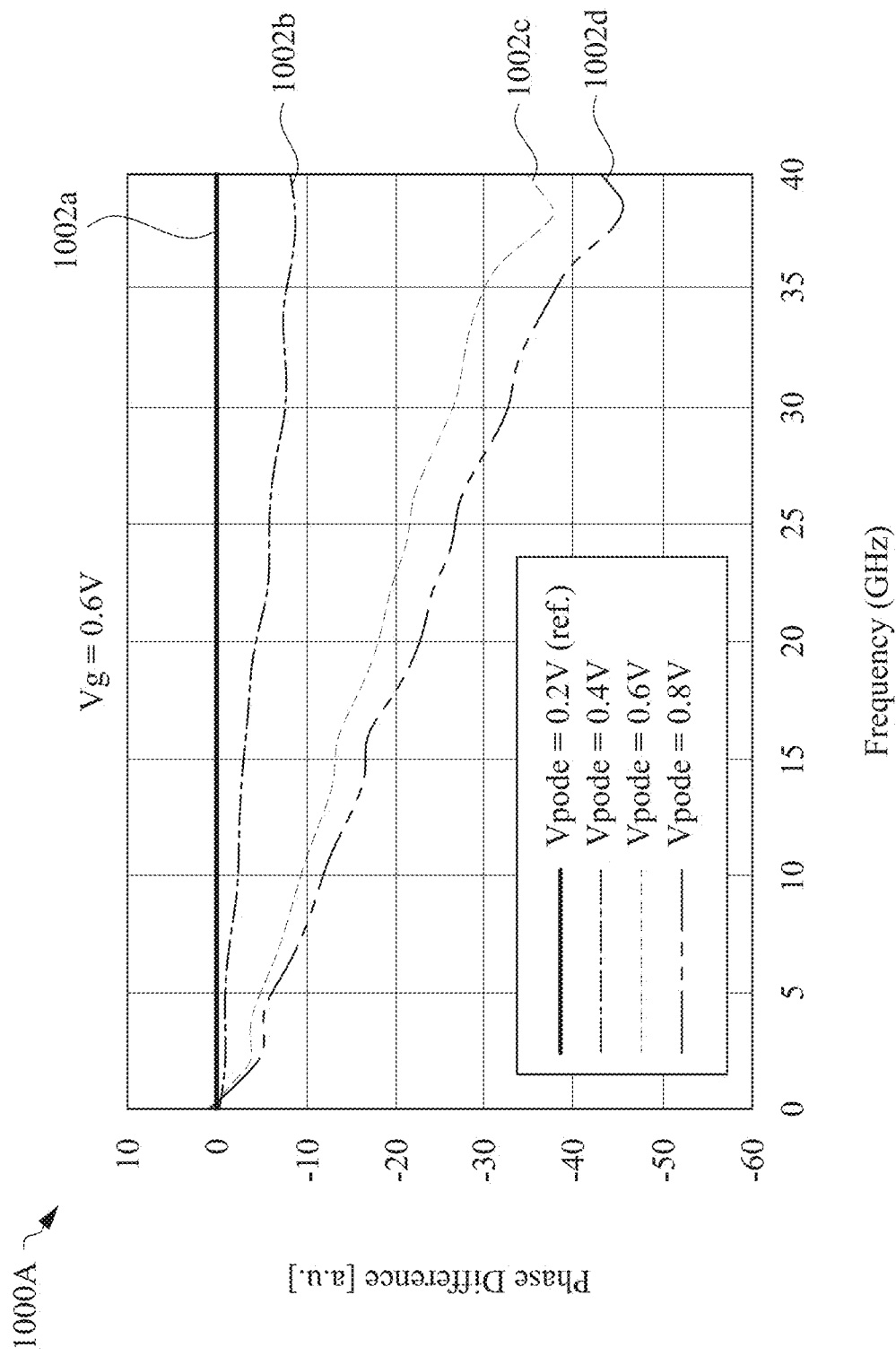
FIGS. 10A-10D illustrate corresponding schematic drawings of a phase difference of a phase shifter circuit usable in FIGS. 2A-2B, in accordance with some embodiments.

In FIG. 10A, schematic drawing 1000A includes curves 1002a, 1002b, 1002c and 1002d for voltage VG being equal to 0.6 Volts. Curve 1002a is for voltage $V_{PODE}$ being equal to 0.2 volts, curve 1002b is for voltage $V_{PODE}$ being equal to 0.4 volts, curve 1002c is for voltage $V_{PODE}$ being equal to 0.6 volts, and curve 1002d is for voltage $V_{PODE}$ being equal to 0.8 volts. As shown in FIG. 10A, for a given frequency of input signal Vin, as the voltage $V_{PODE}$ is increased, the phase difference $\Delta \Theta 1$ also increases.

Figure 10B:
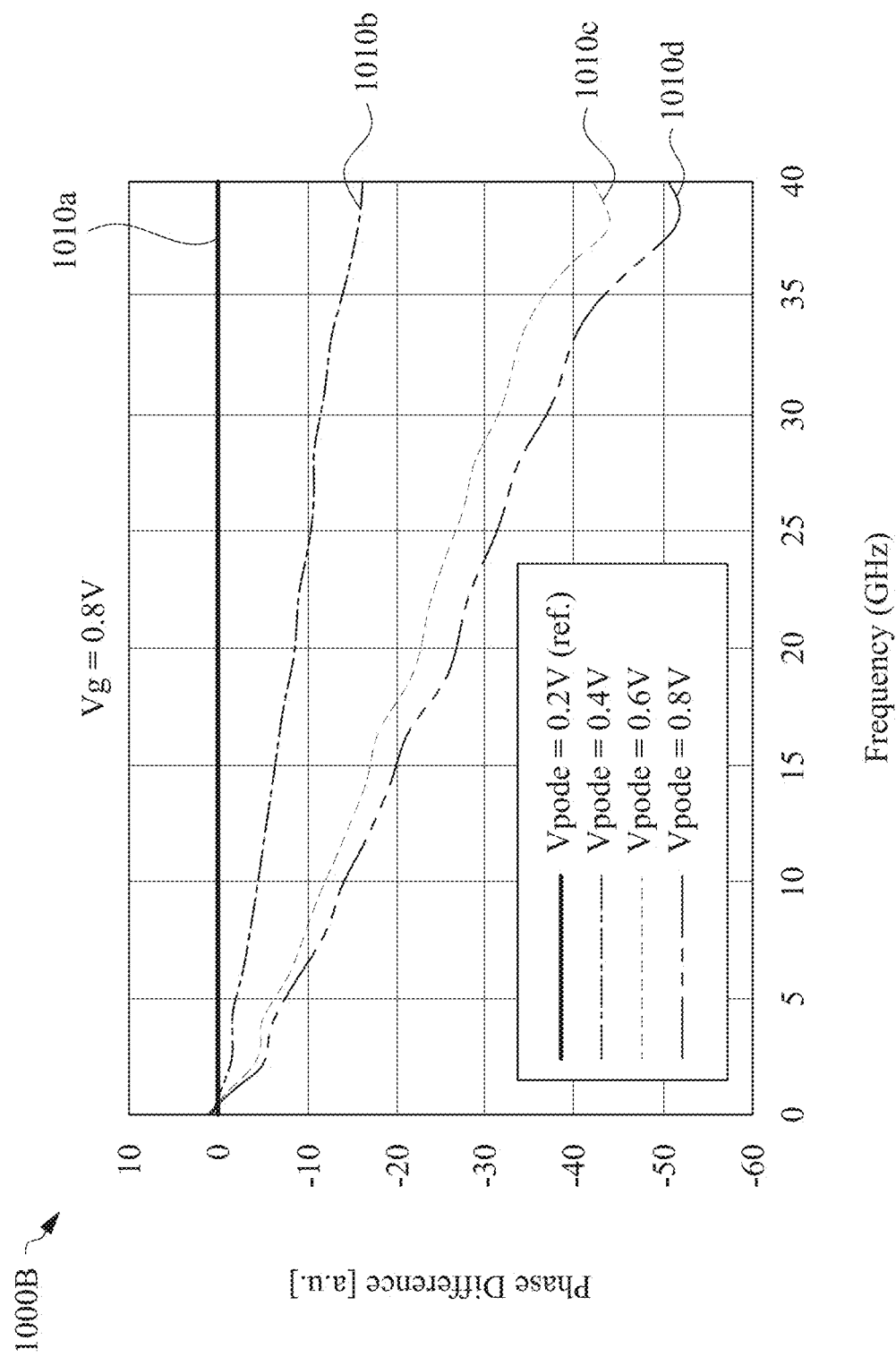

In FIG. 10B, schematic drawing 1000B includes curves 1010a, 1010b, 1010c and 1010d for voltage VG being equal to 0.8 Volts. Curve 1010a is for voltage $V_{PODE}$ being equal to 0.2 volts, curve 1010b is for voltage $V_{PODE}$ being equal to 0.4 volts, curve 1010c is for voltage $V_{PODE}$ being equal to 0.6 volts, and curve 1010d is for voltage $V_{PODE}$ being equal to 0.8 volts. As shown in FIG. 10B, for a given frequency of input signal Vin, as the voltage $V_{PODE}$ is increased, the phase difference $\Delta \Theta_1$ also increases.

Figure 10C:
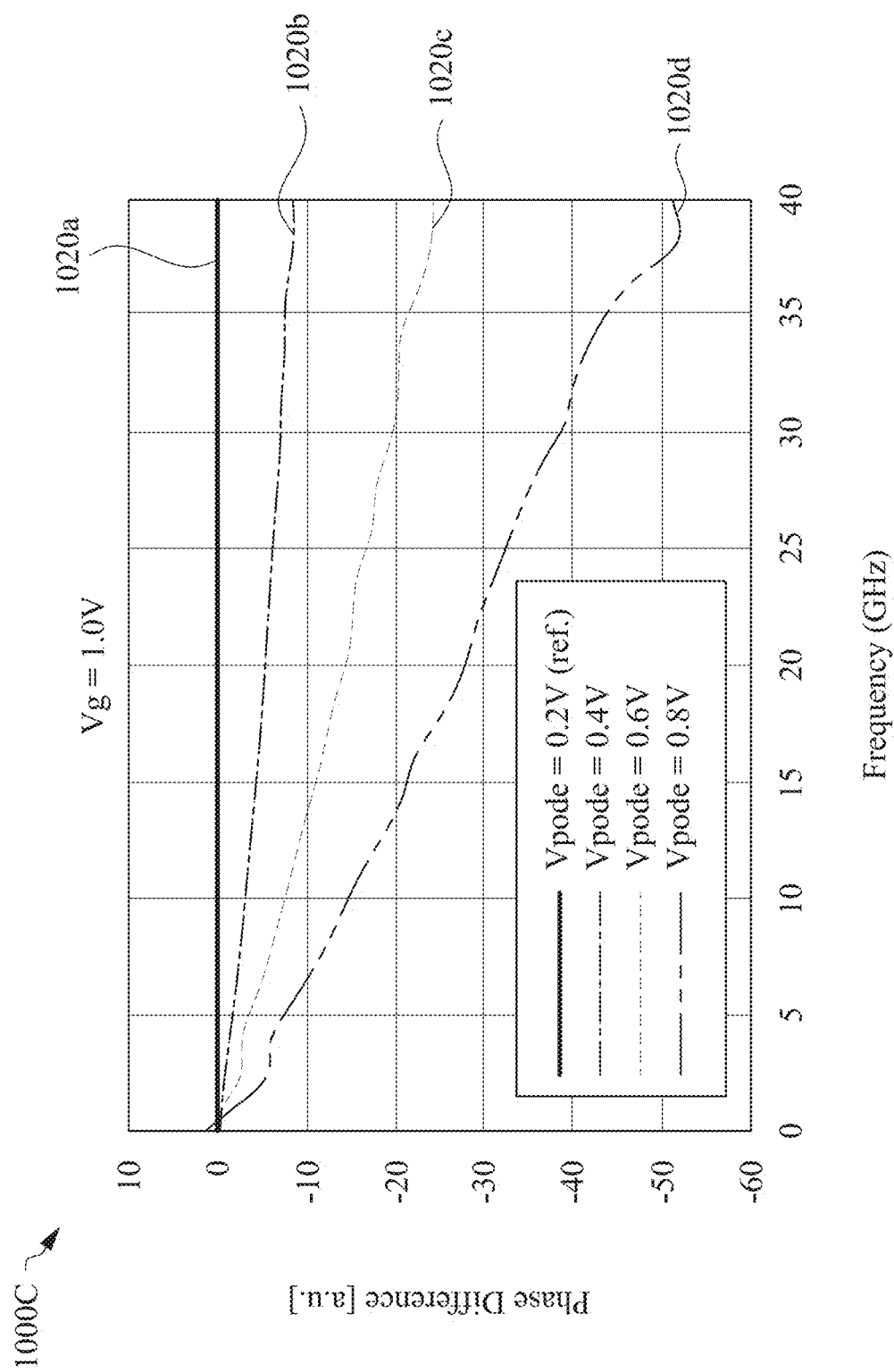

In FIG. 10C, schematic drawing 1000C includes curves 1020a, 1020b, 1020c and 1020d for voltage VG being equal to 1.0 Volts. Curve 1020a is for voltage $V_{PODE}$ being equal to 0.2 volts, curve 1020b is for voltage $V_{PODE}$ being equal to 0.4 volts, curve 1020c is for voltage $V_{PODE}$ being equal to 0.6 volts, and curve 1020d is for voltage $V_{PODE}$ being equal to 0.8 volts. As shown in FIG. 10C, for a given frequency of input signal Vin, as the voltage $V_{PODE}$ is increased, the phase difference $\Delta \Theta 1$ also increases.

Figure 10D:
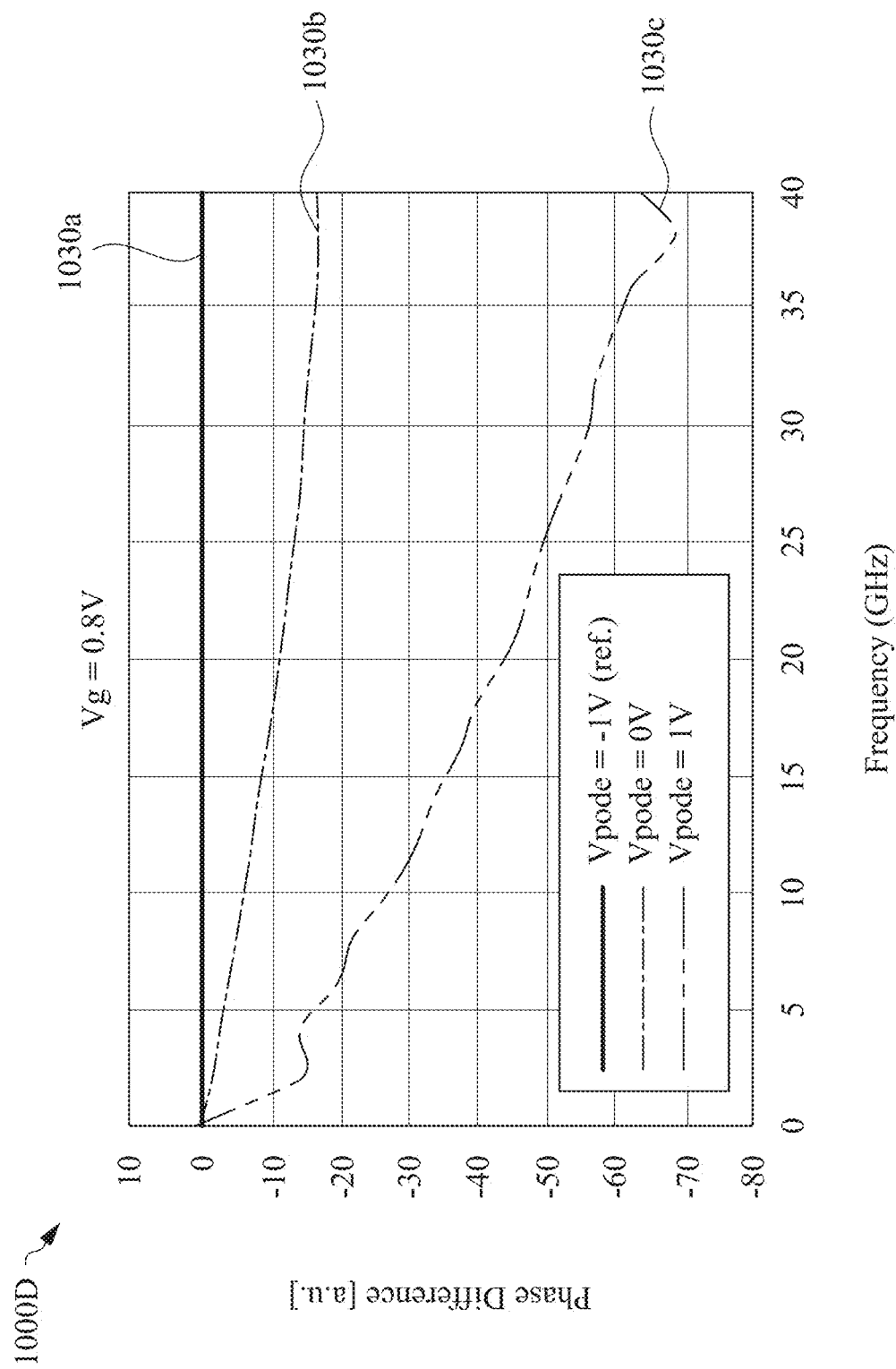

In FIG. 10D, schematic drawing 1000D includes curves 1030a, 1030b and 1030c for voltage VG being equal to 0.8 Volts.

Curve 1030a is for voltage $V_{PODE}$ being equal to −1.0 volts, curve 1030b is for voltage $V_{PODE}$ being equal to 0.0 volts and curve 1030c is for voltage $V_{PODE}$ being equal to 1.0 volt. As shown in FIG. 10D, for a given frequency of input signal Vin, as the voltage $V_{PODE}$ is increased, the phase difference $\Delta \Theta_1$ also increases.

Method

Figure 11:
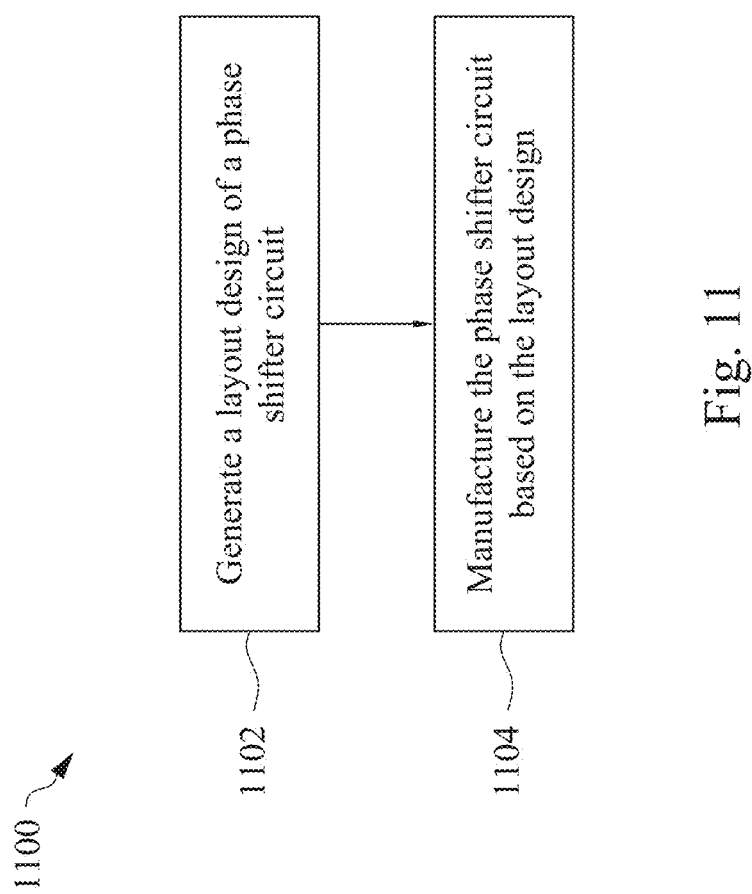
FIG. 11 is a flowchart of a method of forming or manufacturing a phase shifter circuit in accordance with some embodiments.

FIG. 11 is a flowchart of a method 1100 of forming or manufacturing a phase shifter circuit in accordance with some embodiments. It is understood that additional operations may be performed before, during, and/or after the method 1100 depicted in FIG. 11, and that some other operations may only be briefly described herein. In some embodiments, the method 1100 is usable to form phase shifter circuits, such as phase shifter circuit 100 (FIG. 1), phase shifter circuit 200A-200B (FIGS. 2A-2B), phase shifter circuit 400 (FIG. 4), phase shifter circuit 500A-500B (FIGS. 5A-5B), phase shifter circuit 600A-600B (FIGS. 6A-6B), phase shifter circuit 700 (FIG. 7), phase shifter circuit 800A-800B (FIGS. 8A-8B) or phase shifter circuit 900 (FIG. 9). In some embodiments, the method 1100 is usable to form phase shifter circuits having similar structural relationships or patterns as those of layout design 300 (FIG. 3).

In operation 1102 of method 1100, a layout design 300 of a phase shifter circuit (e.g., phase shifter circuit 100, 200A-200B, 400, 500A-500B, 600A-600B, 700, 800A-800B or 900) is generated. Operation 1102 is performed by a processing device (e.g., processor 1302 (FIG. 13)) configured to execute instructions for generating a layout design 300. In some embodiments, the layout design 300 is a graphic database system (GDSII) file format.

FIG. 11

In operation 1104 of method 1100, the phase shifter circuit (e.g., phase shifter circuit 100, 200A-200B, 400, 500A-500B, 600A-600B, 700, 800A-800B or 900) is manufactured based on layout design 300. In some embodiments, operation 1104 of method 1100 comprises manufacturing at least one mask based on the layout design 300, and manufacturing the phase shifter circuit (e.g., phase shifter circuit 100, 200A-200B, 400, 500A-500B, 600A-600B, 700, 800A-800B or 900) based on the at least one mask.

Figure 12:
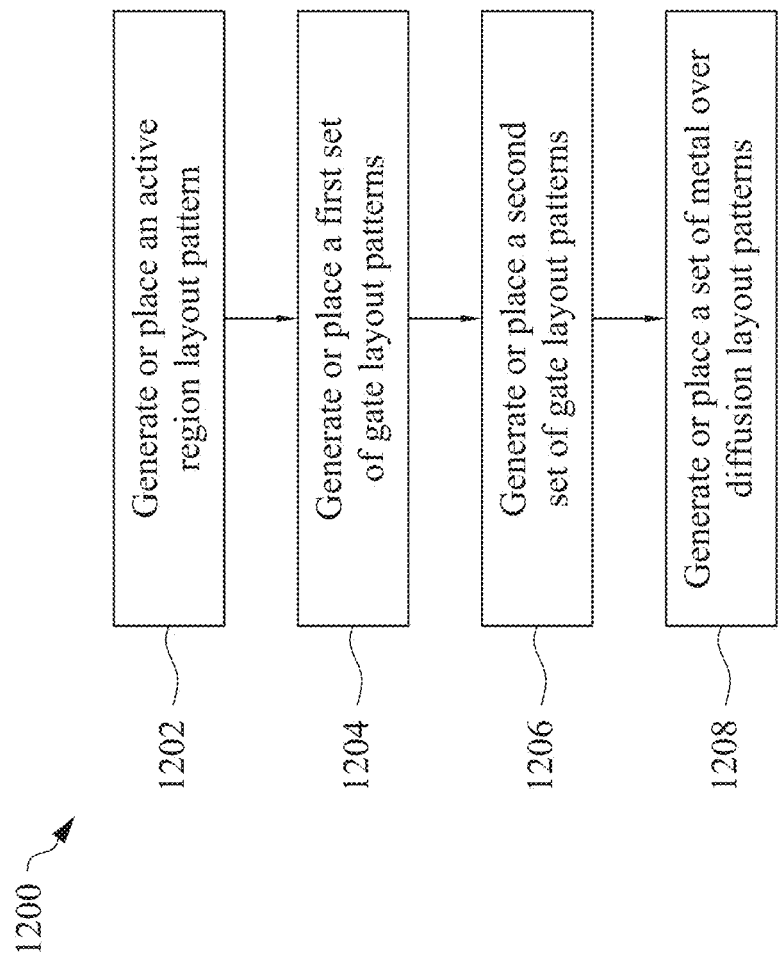
FIG. 12 is a flowchart of a method of generating a layout design of a phase shifter circuit in accordance with some embodiments.

FIG. 12 is a flowchart of a method 1200 of generating a layout design of a phase shifter circuit in accordance with some embodiments. It is understood that additional operations may be performed before, during, and/or after the method 1200 depicted in FIG. 12, and that some other processes may only be briefly described herein. In some embodiments, the method 1200 is usable to generate one or more layout patterns of layout design 300 (FIG. 3) of a phase shifter circuit (e.g., phase shifter circuit 100, 200A-200B, 400, 500A-500B, 600A-600B, 700, 800A-800B or 900).

In operation 1202 of method 1200, an active region layout pattern 302 is generated or placed on layout design 300. In some embodiments, the active region layout pattern 302 corresponds to fabricating an active region 402 on a first level. In some embodiments, first level is the OD or active level.

In operation 1204 of method 1200, a first set of gate layout patterns 304 is generated or placed on layout design 300. In some embodiments, the first set of gate layout patterns 304 corresponds to fabricating a first set of gates 404. In some embodiments, the first set of gate layout patterns 304 is placed on the second level (e.g., POLY).

In some embodiments, operation 1204 comprises generating or placing a first gate layout pattern 304*a*, a second gate layout pattern 304*b*, a third gate layout pattern 304*c* and a fourth gate layout pattern 304*d*.

In operation 1206 of method 1200, a second set of gate layout patterns 306 is generated or placed on layout design 300. In some embodiments, the second set of gate layout patterns 306 corresponds to fabricating a second set of gates 406. In some embodiments, the second set of gate layout patterns 306 is placed on the second level (e.g., POLY). In some embodiments, operation 1206 comprises generating or placing a first gate layout pattern 306*a* and a second gate layout pattern 306*b*.

In operation 1208 of method 1200, a set of metal over diffusion layout patterns 308 is generated or placed on layout design 300. In some embodiments, the set of metal over diffusion layout patterns 308 corresponds to fabricating a set of contacts 408, 708 or 908. In some embodiments, the set of metal over diffusion layout patterns 308 is placed on the third level (e.g., MD).

In some embodiments, operation 1208 comprises generating or placing a first source region layout pattern 308*a*, a first drain region layout pattern 308*b*, a second source region layout pattern 308*c*, a second drain region layout pattern 308*d* and generating a third source region layout pattern 308*e*.

In some embodiments, one or more of the layout patterns of one or more of the operations of method 1200 are placed in a manner similar with the positioning shown in layout design 300, and similar detailed description is therefore omitted. In some embodiments, one or more of operations 1202, 1204, 1206 or 1208 is not performed.

One or more of the operations of methods 1100-1200 is performed by a processing device configured to execute instructions for manufacturing a phase shifter circuit, such as phase shifter circuit 100, 200A-200B, 400, 500A-500B, 600A-600B, 700, 800A-800B or 900. In some embodiments, one or more operations of methods 1100-1200 is performed using a same processing device as that used in a different one or more operations of methods 1100-1200. In some embodiments, a different processing device is used to perform one or more operations of methods 1100-1200 from that used to perform a different one or more operations of methods 1100-1200.

Figure 13:
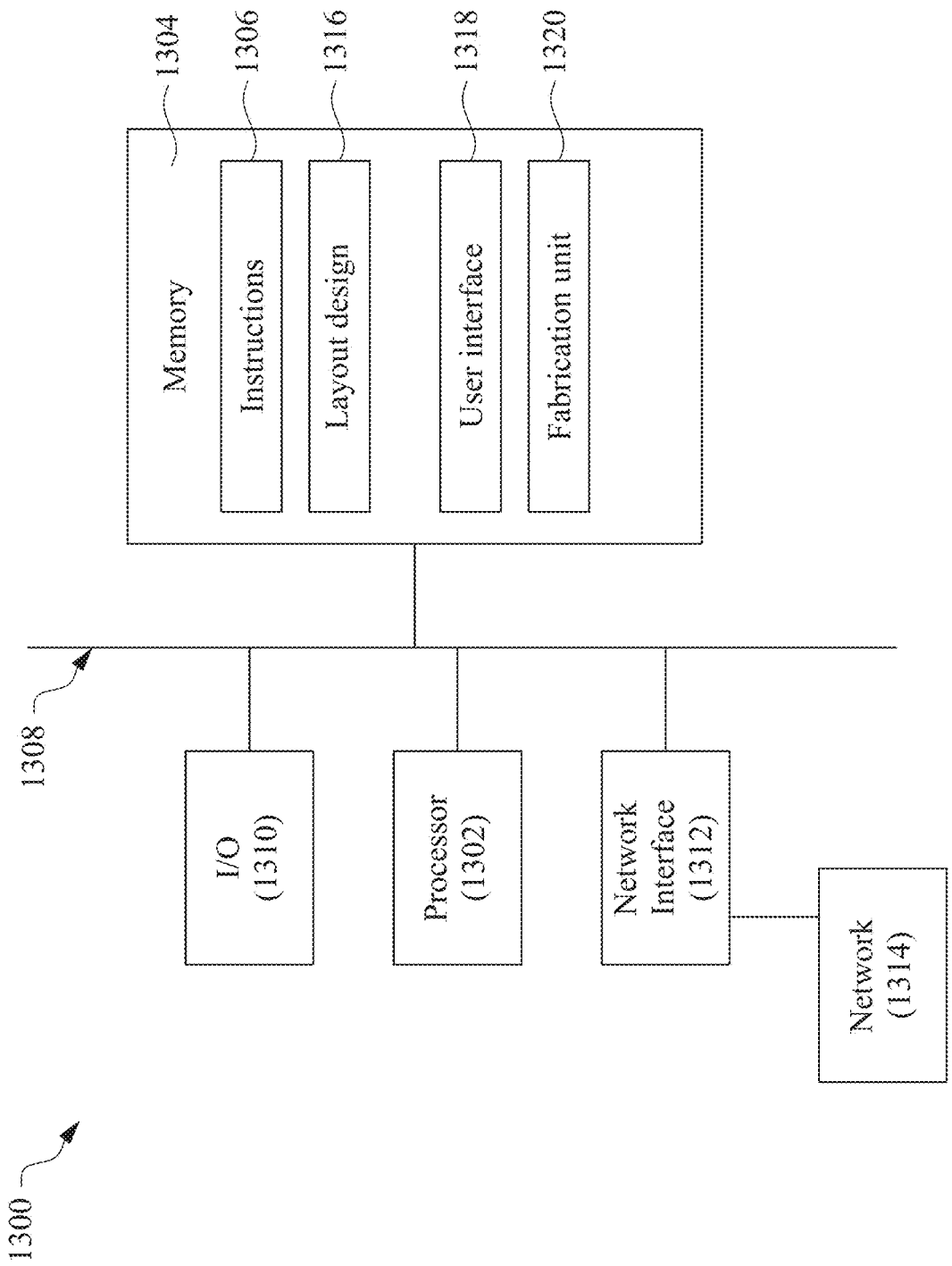
FIG. 13 is a schematic view of a system for designing and manufacturing an IC layout design in accordance with some embodiments.

FIG. 13 is a schematic view of a system 1300 for designing and manufacturing an IC layout design in accordance with some embodiments. In some embodiments, system 1300 generates or places one or more IC layout designs described herein. In some embodiments, system 1300 manufactures one or more ICs based on the one or more IC layout designs described herein. System 1300 includes a hardware processor 1302 and a non-transitory, computer readable storage medium 1304 encoded with, i.e., storing, the computer program code 1306, i.e., a set of executable instructions. Computer readable storage medium 1304 is configured for interfacing with manufacturing machines for producing the integrated circuit. The processor 1302 is electrically coupled to the computer readable storage medium 1304 by a bus 1308. The processor 1302 is also electrically coupled to an I/O interface 1310 by bus 1308. A network interface 1312 is also electrically connected to the processor 1302 by bus 1308. Network interface 1312 is connected to a network 1314, so that processor 1302 and computer readable storage medium 1304 are capable of connecting to external elements via network 1314. The processor 1302 is configured to execute the computer program code 1306 encoded in the computer readable storage medium 1304 in order to cause system 1300 to be usable for performing a portion or all of the operations as described in method 1100 or 1200.

In some embodiments, the processor 1302 is a central processing unit (CPU), a multi-processor, a distributed processing system, an application specific integrated circuit (ASIC), and/or a suitable processing unit.

In some embodiments, the computer readable storage medium 1304 is an electronic, magnetic, optical, electromagnetic, infrared, and/or a semiconductor system (or apparatus or device). For example, the computer readable storage medium 1304 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1304 includes a compact disk-read only memory (CD-ROM), a compact disk-read/write (CD-R/W), and/or a digital video disc (DVD).

In some embodiments, the storage medium 1304 stores the computer program code 1306 configured to cause system 1300 to perform method 1100 or 1200. In some embodiments, the storage medium 1304 also stores information needed for performing method 1100 or 1200 as well as information generated during performance of method 1100 or 1200, such as layout design 1316 and user interface 1318 and fabrication unit 1320, and/or a set of executable instructions to perform the operation of method 1100 or 1200. In some embodiments, layout design 1316 comprises one or more of layout patterns of layout design 300.

In some embodiments, the storage medium 1304 stores instructions (e.g., computer program code 1306) for interfacing with manufacturing machines. The instructions (e.g., computer program code 1306) enable processor 1302 to generate manufacturing instructions readable by the manufacturing machines to effectively implement method 1100 or 1200 during a manufacturing process.

System 1300 includes I/O interface 1310. I/O interface 1310 is coupled to external circuitry. In some embodiments, I/O interface 1310 includes a keyboard, keypad, mouse, trackball, trackpad, and/or cursor direction keys for communicating information and commands to processor 1302.

System 1300 also includes network interface 1312 coupled to the processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interface such as ETHERNET, USB, or IEEE-1394. In some embodiments, method 1100 or 1200 is implemented in two or more systems 1300, and information such as layout design, user interface and fabrication unit are exchanged between different systems 1300 by network 1314.

System 1300 is configured to receive information related to a layout design through I/O interface 1310 or network interface 1312. The information is transferred to processor 1302 by bus 1308 to determine a layout design for producing an IC (e.g., phase shifter circuit 100, 200A-200B, 400, 500A-500B, 600A-600B, 700, 800A-800B or 900). The layout design is then stored in computer readable medium 1304 as layout design 1316. System 1300 is configured to receive information related to a user interface through I/O interface 1310 or network interface 1312. The information is stored in computer readable medium 1304 as user interface 1318. System 1300 is configured to receive information related to a fabrication unit through I/O interface 1310 or network interface 1312. The information is stored in computer readable medium 1304 as fabrication unit 1320. In some embodiments, the fabrication unit 1320 includes fabrication information utilized by system 1300.

In some embodiments, method 1100 or 1200 is implemented as a standalone software application for execution by a processor. In some embodiments, method 1100 or 1200 is implemented as a software application that is a part of an additional software application. In some embodiments, method 1100 or 1200 is implemented as a plug-in to a software application. In some embodiments, method 1100 or 1200 is implemented as a software application that is a portion of an EDA tool. In some embodiments, method 1100 or 1200 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 1100 or 1200 is implemented by a manufacturing device to manufacture an integrated circuit using a set of masks manufactured based on one or more layout designs generated by system 1300. In some embodiments, system 1300 is a manufacturing device to manufacture an integrated circuit using a set of masks manufactured based on one or more layout designs of the present disclosure. In some embodiments, system 1300 of FIG. 13 generates layout designs of an IC that are smaller than other approaches. In some embodiments, system 1300 of FIG. 13 generates layout designs of an IC structure that occupy less area than other approaches. In some embodiments, the IC or IC structure of FIG. 13 includes phase shifter circuit 100, 200A-200B, 400, 500A-500B, 600A-600B, 700, 800A-800B or 900 of the present description.

Figure 14:
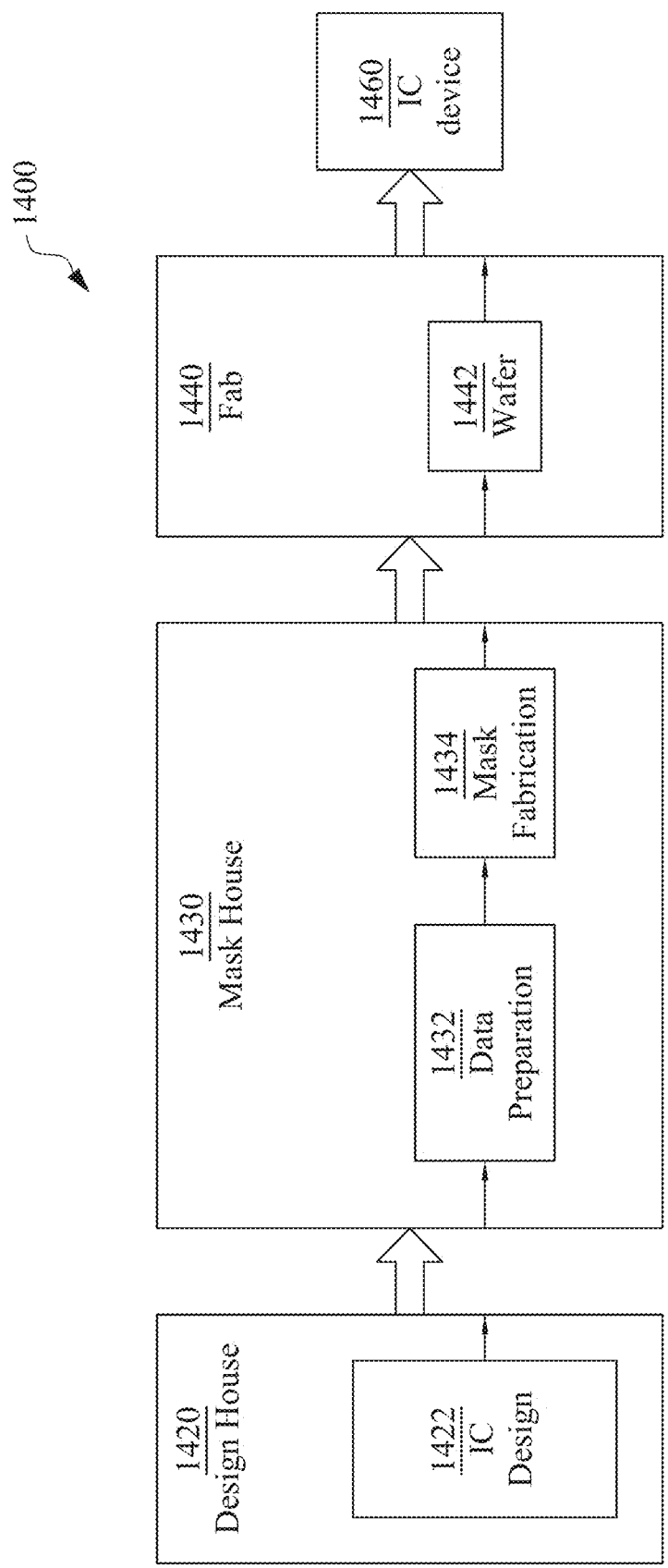
FIG. 14 is a block diagram of an IC manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with at least one embodiment of the present disclosure.

In FIG. 14, IC manufacturing system 1400 includes entities, such as a design house 1420, a mask house 1430, and an IC manufacturer/fabricator ("fab") 1440, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1440 is owned by a single larger company. In some embodiments, two or more of design house 1420, mask house 1430, and IC fab 1440 coexist in a common facility and use common resources.

Design house (or design team) 1420 generates an IC design layout 1422. IC design layout 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout 1422 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout 1422. The design procedure includes one or more of logic design, physical design or place and route. IC design layout 1422 is presented in one or more data files having information of the geometrical patterns. For example, IC design layout 1422 can be expressed in a GDSII file format or DFII file format.

Mask house 1430 includes data preparation 1432 and mask fabrication 1434. Mask house 1430 uses IC design layout 1422 to manufacture one or more masks to be used for fabricating the various layers of IC device 1460 according to IC design layout 1422. Mask house 1430 performs mask data preparation 1432, where IC design layout 1422 is translated into a representative data file ("RDF"). Mask data preparation 1432 provides the RDF to mask fabrication 1434. Mask fabrication 1434 includes a mask writer. A mask writer converts the RDF to an image on a substrate, such as a mask (reticle) or a semiconductor wafer. The design layout is manipulated by mask data preparation 1432 to comply with particular characteristics of the mask writer and/or requirements of IC fab 1440. In FIG. 14, mask data preparation 1432 and mask fabrication 1434 are illustrated as separate elements. In some embodiments, mask data preparation 1432 and mask fabrication 1434 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1434, which may undo part of the modifications performed by OPC in order to meet mask creation rules.

In some embodiments, mask data preparation 1432 includes lithography process checking (LPC) that simulates processing that will be implemented by IC fab 1440 to fabricate IC device 1460. LPC simulates this processing based on IC design layout 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1422.

It should be understood that the above description of mask data preparation 1432 has been simplified for the purposes of clarity. In some embodiments, data preparation 1432 includes additional features such as a logic operation (LOP) to modify the IC design layout according to manufacturing rules. Additionally, the processes applied to IC design layout 1422 during data preparation 1432 may be executed in a variety of different orders.

After mask data preparation 1432 and during mask fabrication 1434, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1434 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1440 is an IC fabrication entity that includes one or more manufacturing facilities for the fabrication of a variety of different IC products. In some embodiments, IC Fab 1440 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1440 uses the mask (or masks) fabricated by mask house 1430 to fabricate IC device 1460. Thus, IC fab 1440 at least indirectly uses IC design layout 1422 to fabricate IC device 1460. In some embodiments, a semiconductor wafer 1442 is fabricated by IC fab 1440 using the mask (or masks) to form IC device 1460. Semiconductor wafer 1442 includes a silicon substrate or other proper substrate having material layers formed thereon. Semiconductor wafer further includes one or more of various doped regions, dielectric features, multilevel interconnects, and the like (formed at subsequent manufacturing steps).

System 1400 is shown as having design house 1420, mask house 1430 or IC fab 1440 as separate components or entities. However, it is understood that one or more of design house 1420, mask house 1430 or IC fab 1440 are part of the same component or entity.

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a phase shifter circuit. In some embodiments, the phase shifter includes a first transistor and a second transistor. In some embodiments, the first transistor includes a first gate terminal configured to receive a first voltage. In some embodiments, the first transistor is configured to adjust at least a resistance or a first capacitance of the phase shifter responsive to the first voltage. In some embodiments, the second transistor is coupled to the first transistor. In some embodiments, the second transistor includes a second gate terminal configured to receive a second voltage. In some embodiments, the second transistor is configured to adjust a second capacitance of the phase shifter responsive to the second voltage. In some embodiments, the second gate terminal includes a first polysilicon portion and a second polysilicon portion extending in a first direction. In some embodiments, the first polysilicon portion and the second polysilicon portion are positioned along opposite edges of an active region of the first transistor and the second transistor. In some embodiments, the first transistor and the second transistor are a FinFET of a first type. In some embodiments, the first transistor further includes a first drain terminal configured as an input terminal of the phase shifter and a first source terminal. In some embodiments, the second transistor further includes a second source terminal, wherein the first source terminal of the first transistor and the second source terminal of the second transistor are configured as an output terminal of the phase shifter, and the first gate terminal of the first transistor is configured to adjust the resistance of the phase shifter responsive to the first voltage. In some embodiments, the phase shifter further includes an input terminal configured to receive an input signal having a first phase, an output terminal configured to output an output signal having a second phase different from the first phase, and a resistor having a first end coupled to the input terminal of the phase shifter. In some embodiments, the first transistor further includes a first drain terminal, a first source terminal. In some embodiments, the second transistor further includes a second source terminal. In some embodiments, the first source terminal of the first transistor, the second source terminal of the second transistor and a second end of the resistor are coupled to the output terminal of the phase shifter. In some embodiments, the first drain terminal of the first transistor and the second drain terminal of the second transistor are coupled to a reference voltage supply. In some embodiments, the first gate terminal of the first transistor is configured to adjust the resistance of the phase shifter responsive to the first voltage. In some embodiments, the phase shifter further includes an input terminal configured to receive an input signal having a first phase, an output terminal configured to output an output signal having a second phase different from the first phase and a resistor having a first end coupled to the input terminal of the phase shifter. In some embodiments, the first transistor further includes a first drain terminal, and a first source terminal. In some embodiments, the second transistor further includes a second source terminal. In some embodiments, the first source terminal of the first transistor, the second source terminal of the second transistor and a second end of the resistor are coupled to the output terminal of the phase shifter. In some embodiments, the first drain terminal of the first transistor and the second drain terminal of the second transistor are electrically floating. In some embodiments, the first gate terminal of the first transistor is configured to adjust the first capacitance of the phase shifter responsive to the first voltage. In some embodiments, the first type is an n-type. In some embodiments, the first type is a p-type.

Another aspect of this description relates to a phase shifter circuit. In some embodiments, the phase shifter includes a first transistor and a second transistor. The first transistor includes a first gate terminal configured to receive a first voltage. The first transistor is configured to adjust at least a resistance or a first capacitance of the phase shifter responsive to the first voltage. The second transistor is coupled to the first transistor. The second transistor includes a second gate terminal configured to receive a second voltage. The second transistor is configured to adjust a second capacitance of the phase shifter responsive to the second voltage. The second gate terminal includes a first polysilicon portion and a second polysilicon portion extending in a first direction. The first polysilicon portion and the second polysilicon portion are positioned along opposite edges of an active region of the first transistor and the second transistor.

Still another aspect of this description relates to a method of forming a phase shifter. In some embodiments, the method includes generating, by a processor, a layout design of the phase shifter, and manufacturing the phase shifter based on the layout design. In some embodiments, the generating of the layout design includes generating a first active region layout pattern corresponding to fabricating a first active region, generating a first set of gate layout patterns corresponding to fabricating a first set of gates, generating a second set of gate layout patterns corresponding to fabricating a second set of gates, and generating a set of metal over diffusion layout patterns corresponding to fabricating a set of contacts wherein at least one of the above layout patterns is stored in a non-transitory computer-readable medium, and at least one of the above generating operations is performed by a hardware processor. In some embodiments, the first active region layout pattern extends in a first direction and is located at a first level. In some embodiments, the first set of gate layout patterns extends in a second direction different from the first direction, overlaps the first active region layout pattern, is located at a second level different from the first level. In some embodiments, each gate layout pattern of the first set of gate layout patterns is separated from another gate layout pattern of the first set of gate layout patterns in the first direction. In some embodiments, the second set of gate layout patterns extends in the second direction, overlaps the first active region layout pattern, is located at the second level, and is positioned along opposite edges of the first active region layout pattern. In some embodiments, the second set of gates is part of a first transistor configured to adjust a first capacitance of the phase shifter responsive to a first voltage. In some embodiments, the set of metal over diffusion layout patterns extends in the second direction, overlaps the first active region layout pattern, is located at a third level different from the first level, and is positioned between the second set of gate layout patterns. In some embodiments, the generating the set of metal over diffusion layout patterns includes generating a first source region layout pattern corresponding to fabricating a first source contact, generating a first drain region layout pattern corresponding to fabricating a first drain contact, generating a second source region layout pattern corresponding to fabricating a second source contact, generating a second drain region layout pattern corresponding to fabricating a second drain contact, and generating a third source region layout pattern corresponding to fabricating a third source contact. In some embodiments, the first source region layout pattern extends in the second direction, overlaps the first active region layout pattern, is located at the third level, and is positioned between a first gate layout pattern of the first set of gate layout patterns and a first gate layout pattern of the second set of gate layout patterns. In some embodiments, the first drain region layout pattern extends in the second direction, overlaps the first active region layout pattern, is located at the third level, and is positioned between the first gate layout pattern of the first set of gate layout patterns and a second gate layout pattern of the first set of gate layout patterns. In some embodiments, the second source region layout pattern extends in the second direction, overlaps the first active region layout pattern, is located at the third level, and is positioned between the second gate layout pattern of the first set of gate layout patterns and a third gate layout pattern of the first set of gate layout patterns. In some embodiments, the second drain region layout pattern extends in the second direction, overlaps the first active region layout pattern, is located at the third level, and is positioned between the third gate layout pattern of the first set of gate layout patterns and a fourth gate layout pattern of the first set of gate layout patterns. In some embodiments, the third source region layout pattern extends in the second direction, overlaps the first active region layout pattern, is located at the third level, and is positioned between the fourth gate layout pattern of the first set of gate layout patterns and a second gate layout pattern of the second set of gate layout patterns. In some embodiments, the generating the second set of gate layout patterns includes generating a first gate layout pattern corresponding to fabricating a first gate and generating a second gate layout pattern corresponding to fabricating a second gate. In some embodiments, the first gate layout pattern extends in the second direction, overlaps the first active region layout pattern, is located at the second level, and overlaps a first edge of the first active region layout pattern. In some embodiments, the second gate layout pattern extends in the second direction, overlaps the first active region layout pattern, is located at the second level, and overlaps a second edge of the first active region layout pattern opposite from the first edge of the first active region layout pattern, the first gate and the second gate is part of the first transistor. In some embodiments, the generating the first set of gate layout patterns includes generating a first gate layout pattern corresponding to fabricating a first gate, generating a second gate layout pattern corresponding to fabricating a second gate, generating a third gate layout pattern corresponding to fabricating a third gate, and generating a fourth gate layout pattern corresponding to fabricating a fourth gate. In some embodiments, the first gate layout pattern extends in the second direction, overlaps the first active region layout pattern, and is located at the second level. In some embodiments, the second gate layout pattern extends in the second direction, overlaps the first active region layout pattern, and is located at the second level. In some embodiments, the third gate layout pattern extends in the second direction, overlaps the first active region layout pattern, and is located at the second level. In some embodiments, the fourth gate layout pattern extends in the second direction, overlaps the first active region layout pattern, and is located at the second level. In some embodiments, the first gate, the second gate, the third gate and the fourth gate are part of a second transistor configured to adjust a second capacitance or a resistance of the phase shifter responsive to a second voltage. In some embodiments, each of the first gate layout pattern, the second gate layout pattern, the third gate layout pattern and the fourth gate layout pattern are separated from each other in the first direction. In some embodiments, the second gate layout pattern is between the first gate layout pattern and the third gate layout pattern. In some embodiments, the third gate layout pattern is between the second gate layout pattern and the fourth gate layout pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase shifter comprising:
   a first transistor comprising:
      a first gate terminal configured to receive a first voltage, the first transistor configured to adjust at least a resistance or a first capacitance of the phase shifter responsive to the first voltage; and
   a second transistor coupled to the first transistor, the second transistor comprising:
      a second gate terminal configured to receive a second voltage, the second transistor configured to adjust a second capacitance of the phase shifter responsive to the second voltage, the second gate terminal including a first polysilicon portion and a second polysilicon portion extending in a first direction, and the first polysilicon portion and the second polysilicon portion being positioned along opposite edges of an active region of the first transistor and the second transistor.

2. The phase shifter of claim 1, further comprising:
   an input terminal configured to receive an input signal having a first phase;
   an output terminal configured to output an output signal having a second phase different from the first phase;
   a resistor having a first end coupled to the input terminal of the phase shifter;
   the first transistor further comprises:
      a first drain terminal;
      a first source terminal;
   the second transistor further comprises:
      a second source terminal; and
      a second drain terminal, wherein
      the first source terminal of the first transistor, the second source terminal of the second transistor and a second end of the resistor are coupled to the output terminal of the phase shifter,
      the first drain terminal of the first transistor and the second drain terminal of the second transistor are coupled to a reference voltage supply, and
      the first gate terminal of the first transistor is configured to adjust the resistance of the phase shifter responsive to the first voltage.

3. The phase shifter of claim 1, further comprising:
   an input terminal configured to receive an input signal having a first phase;
   an output terminal configured to output an output signal having a second phase different from the first phase;
   a resistor having a first end coupled to the input terminal of the phase shifter;
   the first transistor further comprises:
      a first drain terminal;
      a first source terminal;
   the second transistor further comprises:
      a second source terminal; and
      a second drain terminal, wherein
      the first source terminal of the first transistor, the second source terminal of the second transistor and a second end of the resistor are coupled to the output terminal of the phase shifter,
      the first drain terminal of the first transistor and the second drain terminal of the second transistor are electrically floating, and
      the first gate terminal of the first transistor is configured to adjust the first capacitance of the phase shifter responsive to the first voltage.

4. The phase shifter of claim 1, wherein
   the first transistor further comprises:
      a first drain terminal configured as an input terminal of the phase shifter; and
      a first source terminal; and
   the second transistor further comprises:
      a second source terminal, wherein
      the first source terminal of the first transistor and the second source terminal of the second transistor are configured as an output terminal of the phase shifter, and
      the first gate terminal of the first transistor is configured to adjust the resistance of the phase shifter responsive to the first voltage.

5. The phase shifter of claim 4, wherein
   the first drain terminal extends in the first direction, overlaps the active region, and is between the first polysilicon portion and the second polysilicon portion;
   the first source terminal extends in the first direction, overlaps the active region, and is between the first polysilicon portion and the second polysilicon portion; and
   the second source terminal extends in the first direction, overlaps the active region, and is between the first polysilicon portion and the second polysilicon portion.

6. The phase shifter of claim 1, wherein the first gate terminal includes:
   a third polysilicon portion extending in the first direction, overlapping the active region and being between the first polysilicon portion and the second polysilicon portion; and a fourth polysilicon portion extending in the first direction, overlapping the active region and being between the first polysilicon portion and the second polysilicon portion.

7. The phase shifter of claim 6, wherein the first gate terminal further includes:
a fifth polysilicon portion extending in the first direction, overlapping the active region and being between the first polysilicon portion and the second polysilicon portion; and
a sixth polysilicon portion extending in the first direction, overlapping the active region and being between the first polysilicon portion and the second polysilicon portion.

8. The phase shifter of claim 1, wherein the first transistor and the second transistor are a Fin Field Effect Transistor (FinFET) of a first type.

9. The phase shifter of claim 8, wherein the first type is an n-type.

10. The phase shifter of claim 8, wherein the first type is a p-type.

11. A phase shifter comprising:
a first transistor comprising:
a first gate terminal configured to adjust at least a resistance or a first capacitance of the phase shifter responsive to a first voltage, the first gate terminal including a first set of gates extending in a first direction, and overlapping an active region, each gate of the first set of gates being separated from another gate of the first set of gates in a second direction different from the first direction; and
a second transistor coupled to the first transistor, the second transistor comprising:
a second gate terminal configured to adjust a second capacitance of the phase shifter responsive to a second voltage, the second gate terminal including a first gate and a second gate separated from each other in the second direction, and extending in the first direction, and the first gate and the second gate being positioned along opposite edges of the active region of the first transistor and the second transistor.

12. The phase shifter of claim 11, further comprising:
an input terminal configured to receive an input signal having a first phase;
an output terminal configured to output an output signal having a second phase different from the first phase;
a resistor having a first end coupled to the input terminal of the phase shifter;
the first transistor further comprises:
a first drain terminal;
a first source terminal;
the second transistor further comprises:
a second source terminal; and
a second drain terminal, wherein
the first source terminal of the first transistor, the second source terminal of the second transistor and a second end of the resistor are coupled to the output terminal of the phase shifter,
the first drain terminal of the first transistor and the second drain terminal of the second transistor are electrically floating, and
the first gate terminal of the first transistor is configured to adjust the first capacitance of the phase shifter responsive to the first voltage.

13. The phase shifter of claim 11, wherein
the first transistor further comprises:
a first drain terminal configured as an input terminal of the phase shifter; and
a first source terminal; and
the second transistor further comprises:
a second source terminal, wherein
the first source terminal of the first transistor and the second source terminal of the second transistor are configured as an output terminal of the phase shifter, and
the first gate terminal of the first transistor is configured to adjust the resistance of the phase shifter responsive to the first voltage.

14. The phase shifter of claim 13, wherein
the first drain terminal corresponds to a first contact that extends in the first direction, overlaps the active region, and is between the first gate and the second gate;
the first source terminal corresponds to a second contact that extends in the first direction, overlaps the active region, and is between the second gate and the first drain terminal; and
the second source terminal corresponds to a fourth contact that extends in the first direction, overlaps the active region, and is between the first gate and the first drain terminal.

15. The phase shifter of claim 11, further comprising:
an input terminal configured to receive an input signal having a first phase;
an output terminal configured to output an output signal having a second phase different from the first phase;
a resistor having a first end coupled to the input terminal of the phase shifter;
the first transistor further comprises:
a first drain terminal;
a first source terminal;
the second transistor further comprises:
a second source terminal; and
a second drain terminal, wherein
the first source terminal of the first transistor, the second source terminal of the second transistor and a second end of the resistor are coupled to the output terminal of the phase shifter,
the first drain terminal of the first transistor and the second drain terminal of the second transistor are coupled to a reference voltage supply, and
the first gate terminal of the first transistor is configured to adjust the resistance of the phase shifter responsive to the first voltage.

16. The phase shifter of claim 15, wherein
the first drain terminal corresponds to a first contact that extends in the first direction, overlaps the active region, and is between the first gate and the second gate;
the second drain terminal corresponds to a second contact that extends in the first direction, overlaps the active region, and is between the first gate and the second gate;
the first source terminal corresponds to a third contact that extends in the first direction, overlaps the active region, and is between the first gate and the second gate; and
the second source terminal corresponds to a fourth contact that extends in the first direction, overlaps the active region, and is between the first gate and the second gate.

17. A method of forming a phase shifter, the method comprising:

generating, by a processor, a layout design of the phase shifter, wherein the generating of the layout design comprises:
    generating a first active region layout pattern corresponding to fabricating a first active region, the first active region layout pattern extending in a first direction and being located at a first level;
    generating a first set of gate layout patterns corresponding to fabricating a first set of gates, the first set of gate layout patterns extending in a second direction different from the first direction, overlapping the first active region layout pattern, being located at a second level different from the first level, and each gate layout pattern of the first set of gate layout patterns being separated from another gate layout pattern of the first set of gate layout patterns in the first direction;
    generating a second set of gate layout patterns corresponding to fabricating a second set of gates, the second set of gate layout patterns extending in the second direction, overlapping the first active region layout pattern, being located at the second level, and being positioned along opposite edges of the first active region layout pattern, the second set of gates being part of a first transistor configured to adjust a first capacitance of the phase shifter responsive to a first voltage; and
    generating a set of metal over diffusion layout patterns corresponding to fabricating a set of contacts, the set of metal over diffusion layout patterns extending in the second direction, overlapping the first active region layout pattern, being located at a third level different from the first level, and being positioned between the second set of gate layout patterns;
    wherein at least one of the above layout patterns is stored in a non-transitory computer-readable medium, and at least one of the above generating operations is performed by a hardware processor, and
    manufacturing the phase shifter based on the layout design.

18. The method of claim 17, wherein generating the set of metal over diffusion layout patterns comprises:
    generating a first source region layout pattern corresponding to fabricating a first source contact, the first source region layout pattern extending in the second direction, overlapping the first active region layout pattern, being located at the third level, and being positioned between a first gate layout pattern of the first set of gate layout patterns and a first gate layout pattern of the second set of gate layout patterns;
    generating a first drain region layout pattern corresponding to fabricating a first drain contact, the first drain region layout pattern extending in the second direction, overlapping the first active region layout pattern, being located at the third level, and being positioned between the first gate layout pattern of the first set of gate layout patterns and a second gate layout pattern of the first set of gate layout patterns;
    generating a second source region layout pattern corresponding to fabricating a second source contact, the second source region layout pattern extending in the second direction, overlapping the first active region layout pattern, being located at the third level, and being positioned between the second gate layout pattern of the first set of gate layout patterns and a third gate layout pattern of the first set of gate layout patterns;
    generating a second drain region layout pattern corresponding to fabricating a second drain contact, the second drain region layout pattern extending in the second direction, overlapping the first active region layout pattern, being located at the third level, and being positioned between the third gate layout pattern of the first set of gate layout patterns and a fourth gate layout pattern of the first set of gate layout patterns; and
    generating a third source region layout pattern corresponding to fabricating a third source contact, the third source region layout pattern extending in the second direction, overlapping the first active region layout pattern, being located at the third level, and being positioned between the fourth gate layout pattern of the first set of gate layout patterns and a second gate layout pattern of the second set of gate layout patterns.

19. The method of claim 17, wherein generating the second set of gate layout patterns comprises:
    generating a first gate layout pattern corresponding to fabricating a first gate, the first gate layout pattern extending in the second direction, overlapping the first active region layout pattern, being located at the second level, and overlapping a first edge of the first active region layout pattern; and
    generating a second gate layout pattern corresponding to fabricating a second gate, the second gate layout pattern extending in the second direction, overlapping the first active region layout pattern, being located at the second level, and overlapping a second edge of the first active region layout pattern opposite from the first edge of the first active region layout pattern, the first gate and the second gate being part of the first transistor.

20. The method of claim 17, wherein generating the first set of gate layout patterns comprises:
    generating a first gate layout pattern corresponding to fabricating a first gate, the first gate layout pattern extending in the second direction, overlapping the first active region layout pattern, and being located at the second level;
    generating a second gate layout pattern corresponding to fabricating a second gate, the second gate layout pattern extending in the second direction, overlapping the first active region layout pattern, and being located at the second level;
    generating a third gate layout pattern corresponding to fabricating a third gate, the third gate layout pattern extending in the second direction, overlapping the first active region layout pattern, and being located at the second level; and
    generating a fourth gate layout pattern corresponding to fabricating a fourth gate, the fourth gate layout pattern extending in the second direction, overlapping the first active region layout pattern, and being located at the second level, the first gate, the second gate, the third gate and the fourth gate are part of a second transistor configured to adjust a second capacitance or a resistance of the phase shifter responsive to a second voltage;
    each of the first gate layout pattern, the second gate layout pattern, the third gate layout pattern and the fourth gate layout pattern are separated from each other in the first direction;
    the second gate layout pattern is between the first gate layout pattern and the third gate layout pattern; and the third gate layout pattern is between the second gate layout pattern and the fourth gate layout pattern.

\* \* \* \* \*